United States Patent
Kim et al.

(10) Patent No.: US 9,940,991 B2
(45) Date of Patent: Apr. 10, 2018

(54) MEMORY DEVICE AND MEMORY SYSTEM PERFORMING REQUEST-BASED REFRESH, AND OPERATING METHOD OF THE MEMORY DEVICE

(71) Applicant: Samsung Electronics Co., Ltd., Suwon-si (KR)

(72) Inventors: Hyun-Joong Kim, Hwaseong-si (KR); Ho-young Song, Hwaseong-si (KR); Hoi-ju Chung, Yongin-si (KR); Ju-yun Jung, Hwaseong-si (KR); Sang-uhn Cha, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/343,977

(22) Filed: Nov. 4, 2016

(65) Prior Publication Data
US 2017/0133085 A1    May 11, 2017

(30) Foreign Application Priority Data
Nov. 6, 2015  (KR) .................. 10-2015-0155797

(51) Int. Cl.
| | | |
|---|---|---|
| *G11C 7/00* | (2006.01) |
| *G11C 11/4096* | (2006.01) |
| *G06F 3/06* | (2006.01) |
| *G11C 7/10* | (2006.01) |
| *G11C 11/406* | (2006.01) |
| *G11C 29/02* | (2006.01) |
| *G11C 29/04* | (2006.01) |
| *G11C 29/52* | (2006.01) |
| *G11C 29/50* | (2006.01) |
| *G11C 29/12* | (2006.01) |

(52) U.S. Cl.
CPC ........ *G11C 11/4096* (2013.01); *G06F 3/0619* (2013.01); *G06F 3/0659* (2013.01); *G06F 3/0673* (2013.01); *G11C 7/1063* (2013.01); *G11C 11/40611* (2013.01); *G11C 11/40622* (2013.01); *G11C 29/025* (2013.01); *G11C 29/028* (2013.01); *G11C 29/04* (2013.01); *G11C 29/52* (2013.01); *G11C 29/50016* (2013.01); *G11C 2029/0403* (2013.01); *G11C 2029/0409* (2013.01); *G11C 2029/1202* (2013.01); *G11C 2029/5002* (2013.01); *G11C 2211/4068* (2013.01)

(58) Field of Classification Search
CPC ............ G11C 11/406; G11C 11/40615; G11C 11/40618; G11C 2211/4067
USPC .................................. 365/222, 236
See application file for complete search history.

(56) References Cited

U.S. PATENT DOCUMENTS

| | | |
|---|---|---|
| 4,360,903 A | 11/1982 | Plachno et al. |
| 4,682,306 A | 7/1987 | Sakurai et al. |
| 4,982,369 A | 1/1991 | Tatematsu |
| (Continued) | | |

*Primary Examiner* — Son Dinh
(74) *Attorney, Agent, or Firm* — Muir Patent Law, PLLC

(57) ABSTRACT

Provided are a memory device and a memory system performing request-based refresh, and an operating method of the memory device. The operating method includes: determining a weak row by counting an activated number of at least one row; requesting for refresh on the weak row based on a result of the determining; and performing target refresh on the weak row upon receiving a refresh command according to the requesting.

20 Claims, 29 Drawing Sheets

(56) References Cited

U.S. PATENT DOCUMENTS

| | | |
|---|---|---|
| 5,890,198 A | 3/1999 | Pawlowski |
| 6,343,043 B2 | 1/2002 | Kai et al. |
| 6,356,484 B2 | 3/2002 | Dosaka et al. |
| 6,370,073 B2 | 4/2002 | Leung |
| 6,389,505 B1 | 5/2002 | Emma et al. |
| 6,392,950 B2 | 5/2002 | Ayukawa et al. |
| 6,392,958 B1 | 5/2002 | Lee |
| 6,411,561 B2 | 6/2002 | Ayukawa et al. |
| 6,430,103 B2 | 8/2002 | Nakayama et al. |
| 6,469,948 B2 | 10/2002 | Mizuno et al. |
| 6,504,780 B2 | 1/2003 | Leung |
| 6,510,492 B2 | 1/2003 | Hsu et al. |
| 6,529,433 B2 | 3/2003 | Choi |
| 6,546,468 B2 | 4/2003 | Arimilli et al. |
| 6,546,469 B2 | 4/2003 | Arimilli et al. |
| 6,570,803 B2 | 5/2003 | Kyung |
| 6,587,393 B2 | 7/2003 | Ayukawa et al. |
| 6,601,145 B2 | 7/2003 | Arimilli et al. |
| 6,625,077 B2 | 9/2003 | Chen |
| 6,658,511 B2 | 12/2003 | Yamada et al. |
| 6,661,721 B2 | 12/2003 | Lehmann et al. |
| 6,667,929 B1 | 12/2003 | Zaharinova-Papazova et al. |
| 6,684,302 B2 | 1/2004 | Kershaw |
| 6,690,379 B2 | 2/2004 | Margulis |
| 6,697,909 B1 | 2/2004 | Wang et al. |
| 6,704,237 B2 | 3/2004 | Park |
| 6,707,743 B2 | 3/2004 | Leung et al. |
| 6,708,249 B2 | 3/2004 | Ayukawa et al. |
| 6,714,477 B2 | 3/2004 | Nakayama et al. |
| 6,735,139 B2 | 5/2004 | Tang |
| 6,741,256 B2 | 5/2004 | Emberling |
| 6,741,515 B2 | 5/2004 | Lazar et al. |
| 6,744,684 B2 | 6/2004 | Arimoto et al. |
| 6,751,144 B2 | 6/2004 | Takahashi et al. |
| 6,751,157 B2 | 6/2004 | Leung |
| 6,775,716 B2 | 8/2004 | Tojima et al. |
| 6,778,461 B2 | 8/2004 | Grasso |
| 6,791,877 B2 | 9/2004 | Miura et al. |
| 6,795,364 B1 | 9/2004 | Leung et al. |
| 6,807,077 B2 | 10/2004 | Noda et al. |
| 6,819,618 B2 | 11/2004 | Kashiwazaki |
| 6,822,920 B2 | 11/2004 | Yoo et al. |
| 6,826,106 B2 | 11/2004 | Chen |
| 6,847,573 B2 | 1/2005 | Lee et al. |
| 6,847,575 B2 | 1/2005 | Ayukawa et al. |
| 6,847,578 B2 | 1/2005 | Ayukawa et al. |
| 6,848,035 B2 | 1/2005 | Akiyama et al. |
| 6,854,041 B2 | 2/2005 | Covino et al. |
| 6,857,055 B2 | 2/2005 | Jeddeloh |
| 6,876,593 B2 | 4/2005 | Shi et al. |
| 6,906,977 B2 | 6/2005 | Park |
| 6,909,658 B2 | 6/2005 | Arimoto et al. |
| 6,917,996 B2 | 7/2005 | Togo et al. |
| 6,928,016 B2 | 8/2005 | Nam et al. |
| 6,944,696 B2 | 9/2005 | Yamada et al. |
| 6,948,029 B2 | 9/2005 | Yano |
| 6,976,108 B2 | 12/2005 | Kim et al. |
| 6,999,368 B2 | 2/2006 | Fujimoto et al. |
| 7,016,246 B2 | 3/2006 | Watanabe et al. |
| 7,020,751 B2 | 3/2006 | Kershaw |
| 7,032,105 B2 | 4/2006 | Lin |
| 7,076,600 B2 | 7/2006 | Gavin |
| 7,076,610 B2 | 7/2006 | Au et al. |
| 7,085,186 B2 | 8/2006 | Mobley |
| 7,085,882 B2 | 8/2006 | Lee et al. |
| 7,103,730 B2 | 9/2006 | Saxena et al. |
| 7,120,761 B2 | 10/2006 | Matsuzaki et al. |
| 7,145,819 B2 | 12/2006 | Penchuk |
| 7,152,150 B2 | 12/2006 | Sato et al. |
| 7,180,822 B2 | 2/2007 | Hara et al. |
| 7,187,608 B2 | 3/2007 | Ha et al. |
| 7,206,244 B2 | 4/2007 | Cruz et al. |
| 7,263,020 B2 | 8/2007 | Pyo et al. |
| 7,263,601 B2 | 8/2007 | Henkel |
| 7,295,484 B2 | 11/2007 | Cruz et al. |
| 7,330,928 B2 | 2/2008 | Obinata |
| 7,366,828 B2 | 4/2008 | Sakurai |
| 7,369,451 B2 | 5/2008 | Oh |
| 7,380,083 B2 | 5/2008 | Bellows et al. |
| 7,392,330 B2 | 6/2008 | Weatherspoon |
| 7,436,728 B2 | 10/2008 | Harrand et al. |
| 7,453,758 B2 | 11/2008 | Hoffman |
| 7,505,301 B2 | 3/2009 | Park |
| 7,526,602 B2 | 4/2009 | Kuwabara |
| 7,580,277 B2 | 8/2009 | Fuji |
| 7,590,021 B2 | 9/2009 | Michalak et al. |
| 7,613,061 B2 | 11/2009 | Kohler et al. |
| 7,617,356 B2 | 11/2009 | Bains |
| 7,620,833 B2 | 11/2009 | Gan et al. |
| 7,640,392 B2 | 12/2009 | Walker |
| 7,653,780 B2 | 1/2010 | Takahashi |
| 7,688,662 B2 | 3/2010 | Mobley |
| 7,751,227 B2 | 7/2010 | Fuji |
| 7,752,373 B2 | 7/2010 | Cope |
| 7,757,039 B2 | 7/2010 | Kaburlasos et al. |
| 7,768,859 B2 | 8/2010 | Oh |
| 7,822,911 B2 | 10/2010 | Resnick |
| 7,899,990 B2 | 3/2011 | Moll et al. |
| 7,907,464 B2 | 3/2011 | Oh |
| 7,911,825 B2 | 3/2011 | Matsuzaki et al. |
| 7,917,692 B2 | 3/2011 | Keeth et al. |
| 7,930,471 B2 | 4/2011 | Walker |
| 7,953,921 B2 | 5/2011 | Walker et al. |
| 7,962,715 B2 | 6/2011 | Ware |
| 7,978,721 B2 | 7/2011 | Jeddeloh |
| 7,990,795 B2 | 8/2011 | Pelley, III et al. |
| 7,996,603 B2 | 8/2011 | Matsutani |
| 8,001,334 B2 | 8/2011 | Lee |
| 8,004,617 B2 | 8/2011 | Klebanov et al. |
| 8,108,609 B2 | 1/2012 | Barth et al. |
| 8,116,161 B2 | 2/2012 | Shu et al. |
| 8,171,211 B2 | 5/2012 | Walker |
| 8,209,480 B2 | 6/2012 | Kaburlasos et al. |
| RE43,565 E | 8/2012 | Lee |
| 8,250,298 B2 | 8/2012 | Elnozahy et al. |
| 8,331,184 B2 | 12/2012 | Wang |
| 8,345,496 B2 | 1/2013 | Nakamura |
| 8,374,047 B2 | 2/2013 | Oh |
| 8,400,859 B2 | 3/2013 | Pelley, III et al. |
| 8,407,411 B2 | 3/2013 | Lin |
| 8,422,314 B2 | 4/2013 | Lee |
| 8,463,987 B2 | 6/2013 | Abraham et al. |
| 8,539,310 B2 | 9/2013 | Sasaki |
| 8,543,777 B2 | 9/2013 | Koganezawa |
| 8,547,776 B2 | 10/2013 | Suzuki et al. |
| 8,549,217 B2 | 10/2013 | Takahashi |
| 8,582,383 B2 | 11/2013 | Takahashi |
| 8,588,017 B2 | 11/2013 | Park et al. |
| RE44,628 E | 12/2013 | Charles |
| 8,631,194 B2 | 1/2014 | Wakasa |
| 8,635,511 B2 | 1/2014 | Takeuchi et al. |
| 8,639,874 B2 | 1/2014 | Maule et al. |
| 8,656,086 B2 | 2/2014 | Zimmerman |
| 8,687,456 B2 | 4/2014 | Sato et al. |
| 8,711,653 B2 | 4/2014 | Nayak et al. |
| 8,713,264 B2 | 4/2014 | Henriksson et al. |
| 8,934,311 B2 | 1/2015 | Yu et al. |
| 8,996,818 B2 | 3/2015 | Sim et al. |
| 9,021,176 B2 | 4/2015 | Resnick |
| 9,052,899 B2 | 6/2015 | Thomas et al. |
| 9,070,420 B2 | 6/2015 | Wei et al. |
| 9,086,882 B2 | 7/2015 | Poddar |
| 2001/0040580 A1 | 11/2001 | Margulis |
| 2002/0069319 A1 | 6/2002 | Lee et al. |
| 2002/0110038 A1 | 8/2002 | Harrand et al. |
| 2002/0171649 A1 | 11/2002 | Fogg |
| 2003/0018895 A1 | 1/2003 | Morrison |
| 2003/0084235 A1 | 5/2003 | Mizuki |
| 2003/0097535 A1 | 5/2003 | Shu et al. |
| 2003/0214326 A1 | 11/2003 | Craimer |
| 2004/0047209 A1 | 3/2004 | Lien et al. |
| 2004/0133730 A1 | 7/2004 | Harrand et al. |
| 2005/0015538 A1 | 1/2005 | Vant et al. |
| 2005/0108460 A1 | 5/2005 | David |

(56) References Cited

U.S. PATENT DOCUMENTS

| | | |
|---|---|---|
| 2005/0185496 A1 | 8/2005 | Kaler |
| 2005/0195975 A1 | 9/2005 | Kawakita |
| 2005/0226079 A1 | 10/2005 | Zhu et al. |
| 2006/0158948 A1 | 7/2006 | Fuji |
| 2006/0209610 A1 | 9/2006 | Dono |
| 2008/0270683 A1 | 10/2008 | Barth et al. |
| 2009/0122619 A1 | 5/2009 | Sartore et al. |
| 2009/0193186 A1 | 7/2009 | Barth, Jr. et al. |
| 2009/0193187 A1 | 7/2009 | Barth, Jr. et al. |
| 2009/0204835 A1 | 8/2009 | Smith |
| 2009/0204837 A1 | 8/2009 | Raval et al. |
| 2010/0070777 A1 | 3/2010 | Salters et al. |
| 2011/0093763 A1 | 4/2011 | Salters |
| 2011/0154061 A1 | 6/2011 | Chilukuri et al. |
| 2012/0127817 A1* | 5/2012 | Fujishiro ............... G11C 11/406 365/222 |
| 2012/0281489 A1 | 11/2012 | Ware et al. |
| 2013/0268727 A1 | 10/2013 | Sohn et al. |
| 2014/0032829 A1 | 1/2014 | Solihin |
| 2014/0181558 A1 | 6/2014 | Taha et al. |
| 2014/0189400 A1 | 7/2014 | Tsao |
| 2014/0204105 A1 | 7/2014 | Fang et al. |
| 2014/0281202 A1 | 9/2014 | Hunter et al. |
| 2014/0289574 A1 | 9/2014 | Tsern et al. |
| 2014/0317360 A1 | 10/2014 | Campbell |
| 2014/0334224 A1 | 11/2014 | Cordero et al. |
| 2014/0334225 A1 | 11/2014 | Cordero et al. |
| 2014/0334238 A1 | 11/2014 | Ware et al. |
| 2014/0344513 A1 | 11/2014 | Lo et al. |
| 2014/0351503 A1 | 11/2014 | Jeddeloh et al. |
| 2015/0003172 A1* | 1/2015 | Kim ................ G11C 11/40607 365/189.05 |
| 2015/0058549 A1 | 2/2015 | Jeffrey et al. |
| 2015/0186279 A1 | 7/2015 | Dong et al. |
| 2015/0199234 A1 | 7/2015 | Choi et al. |
| 2015/0206558 A1 | 7/2015 | Ni et al. |
| 2015/0220135 A1 | 8/2015 | Huang et al. |
| 2015/0228328 A1 | 8/2015 | Cordero et al. |

* cited by examiner

MEMORY DEVICE AND MEMORY SYSTEM PERFORMING REQUEST-BASED REFRESH, AND OPERATING METHOD OF THE MEMORY DEVICE

CROSS-REFERENCE TO RELATED APPLICATION

This application claims the benefit of priority under 35 U.S.C. § 119 to Korean Patent Application No. 10-2015-0155797, filed on Nov. 6, 2015, in the Korean Intellectual Property Office, the disclosure of which is incorporated herein in its entirety by reference.

BACKGROUND

The disclosed concepts relate to a memory device, and more particularly, to a memory device and a memory system performing request-based refresh, and an operating method of the memory device.

The capacity and speed of memory devices widely used in a high performance electronic system are increasing. As an example of these memory devices, dynamic random access memory (DRAM) is a volatile memory that determines data according to a charge stored in a capacitor.

As a degree of integration of the memory device increases, a time period a memory cell stores data may decrease, and to prevent data loss, various types of refresh designs may be applied to the memory device to retain data. However, because the reasons for data loss can vary, there is a limit to preventing data loss of a memory cell by using a generalized refresh design.

SUMMARY

The disclosed concepts provide a memory device and a memory system for reducing a possibility of data loss by improving a refresh design, and an operating method of the memory device.

According to some aspects, this disclosure is directed to an operating method of a memory device, the operating method comprising: determining, by the memory device, a weak row based on a counting of an activated number of at least one row; outputting, to a memory controller, a request for refresh on the weak row based on a result of the determining; receiving, from the memory controller, a refresh command in response to the request for the refresh; and performing request-based refresh on the weak row in response to the receiving of the refresh command.

According to other aspects, this disclosure is directed to an operating method of a memory device, the operating method comprising: repeatedly performing normal refresh N times and target refresh M times, wherein M and N are each integers having values equal to or greater than 1; determining, by the memory device, an existence of conditions to perform request-based refresh on at least one row; outputting, to a memory controller, a request signal for requesting a refresh command based on a result of the determining; receiving, from the memory controller, the refresh command in response to the request signal; and performing a request-based refresh on the at least one row in response to receiving the refresh command, wherein the request-based refresh is performed in addition to the normal refresh and the target refresh.

According to other aspects, this disclosure is directed to an operating method of a memory system comprising a memory controller, the operating method comprising: generating, by the memory controller, a first command related to writing and reading; receiving, from a memory device, a request signal for requesting to output a refresh command; generating, by the memory controller, a second command related to request-based refresh in response to the request signal; and outputting, to the memory device, the second command based on scheduling of the first and second commands.

According to other aspects, this disclosure is directed to a memory device comprising: a memory cell array comprising a plurality of rows; a refresh controller configured to control a refresh operation on the plurality of rows; and control logic configured to determine existence of conditions for performing request-based refresh on the at least one row during operation of the memory device, and output a request signal for requesting a refresh command based on the determining the existence of the conditions.

According to other aspects, this disclosure is directed to a memory device comprising: a memory cell array comprising a plurality of rows; a refresh controller configured to control a refresh operation on the plurality of rows; and control logic configured to determine a weak row based on a counting of an activated number of at least one row, output a request for refresh on the weak row based on a result of the determining, receive a refresh command in response to the request for the refresh, and perform request-based refresh on the weak row in response to the receiving of the refresh command.

BRIEF DESCRIPTION OF THE DRAWINGS

The disclosed embodiments will be more clearly understood from the following detailed description taken in conjunction with the accompanying drawings in which.

DETAILED DESCRIPTION OF THE EMBODIMENTS

Since dynamic random access memory (DRAM) as a memory device has finite data retention characteristics, the validity of data may not be guaranteed after a certain time period (typically defined by a memory device specification), even in a normal cell. To improve stable data retention, a refresh policy is used. For example, a memory controller provides a refresh command to a memory device according to refresh cycles set as a specification value such that memory cells are refreshed. Also, the memory device may enter into a self-refresh mode, and in the self-refresh mode, the memory device may refresh the memory cells by internally generating an address without having to receive a separate command from the memory controller.

Figure 1:
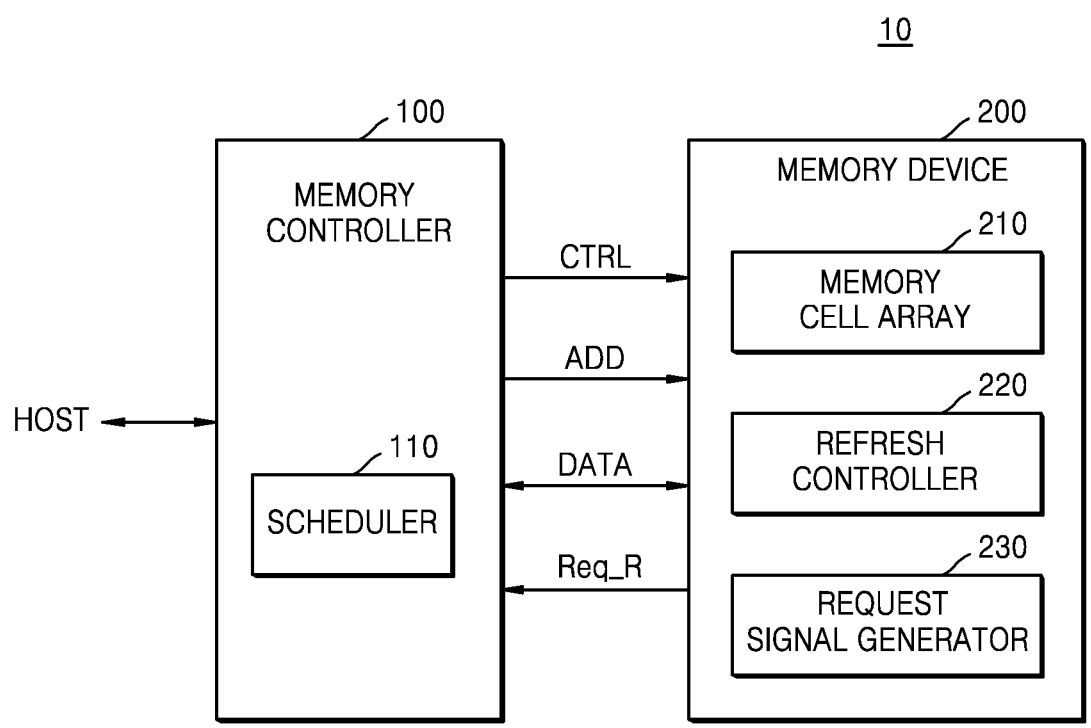
FIG. 1 is a block diagram of a memory system according to an exemplary embodiment.

FIG. 1 is a block diagram of a memory system 10 according to an exemplary embodiment. As shown in FIG. 1, the memory system 10 may include a memory controller 100 and a memory device 200. The memory controller 100 controls memory operations, such as writing and reading, by providing various signals to the memory device 200. For example, the memory controller 100 may access data DATA of a memory cell array 210 by providing a command CMD and an address ADD to the memory device 200. The command CMD may include commands related to various memory operations, such as writing data and reading data. When the memory device 200 includes a DRAM cell, the command CMD may include commands related to various operations intrinsic to the DRAM cell, such as, for example, a refresh command for refreshing memory cells. The memory controller 100 may include a scheduler 110 that manages output of the command CMD to the memory device 200.

The memory cell array 210 may include a plurality of memory regions (not shown). A memory region may be variously defined. For example, the memory cell array 210 may include a plurality of rows and a plurality of banks. When the memory cell array 210 includes a plurality of banks, memory operations or refresh operations may be managed according to banks, and accordingly, the address ADD provided by the memory controller 100 may include a bank address. For example, rows of the plurality of banks may be sequentially refreshed or simultaneously refreshed. In some embodiments, the rows of the plurality of banks may be refreshed sequentially in response to one refresh command, such as an all bank refresh command. The refresh operations in each bank may occur simultaneously with one another.

The memory controller 100 may access the memory device 200 according to a request from a host HOST. The memory controller 100 may communicate with the host HOST using various protocols. For example, the memory controller 100 may communicate with the host HOST using an interface protocol, such as, for example, peripheral component interconnect-express (PCI-E), advanced technology attachment (ATA), serial ATA (SATA), parallel ATA (PATA), or serial attached SCSI (SAS). In addition, any one of various interface protocols, such as universal serial bus (USB), multi-media card (MMC), enhanced small disk interface (ESDI), and integrated drive electronics (IDE), may be applied to a protocol between the host HOST and the memory controller 100.

According to an exemplary embodiment, the memory controller 100 may include a scheduler 110 that manages output of the command CMD to the memory device 200. Also, the memory device 200 may include a refresh controller 220 for controlling refresh operations performed on the plurality of rows of the memory cell array 210. Also, the memory device 200 may determine that a refresh of at least one row of the memory cell array 210 is necessary. The memory device 200 may further include a request signal generator 230 configured to generate and output to the memory controller 100 a request signal Req_R requesting the memory controller 100 to generate and output to the memory device 200 a refresh command. For example, when the memory device 200 determines that a target or supplemental refresh is to be performed on at least one row of the memory cell array 210, the request signal generator 230 may generate a request signal Req_R requesting the memory controller 100 to output a refresh command to the memory device 200. As discussed further herein, the target or supplemental refresh may be performed when it is determined that one or more conditions have been met.

During a normal refresh mode of the memory device 200, the refresh controller 220 may refresh the rows of the memory cell array 210 in response to the refresh command from the memory controller 100. For example, during normal refresh mode, the memory controller 100 may keep track of a refresh period tREF (e.g., via an internal timer) so that normal rows of a memory device 200 are refreshed once per refresh period tREF (or every refresh cycle). The refreshing of the normal rows by the memory controller 100 may occur at a timing determined solely by the memory controller 100 (e.g., without further timing information from the memory controller during the refresh period). For example, when the memory cell array 210 includes N rows, the refresh controller 220 may refresh the N rows in response to N refresh commands provided from the memory controller 100 within certain refresh cycles. In some embodiments, the refresh controller 220 may refresh the N rows in response to N individual normal refresh commands provided from the memory controller 100 and may refresh the M rows in response to M individual targeted refresh commands provided from the memory controller 100. In certain embodiments, when the refresh controller 220 receives a refresh command from the memory controller 100, the refresh controller 220 may perform a request-based refresh, refreshing a row of the memory cell array 210 based on the refresh command and an address ADD identifying the row upon which the refresh is to be performed. In other normal refresh operations, the memory controller 100 may issue refresh commands in an auto-refresh mode, where refresh commands are issued to the memory device 200 without address information, and the memory device 200 internally tracks the address of normal rows to be refreshed with an address counter (that sequences through all row addresses of the memory device 200 in response to the received auto-refresh commands every tREF period). For example, the memory controller 100 may issue an all bank refresh command which instructs the memory device 200 to refresh all rows of all the banks of the memory device 200, or issue a bank refresh command instructing the memory device 200 to refresh a particular bank of the memory device 200. In response to the all bank refresh command and bank refresh command, the memory device 200 may refresh rows corresponding to row addresses outputted by a sequentially incremented counter of the memory device 200.

Also, for example, the memory cell array 210 may include N rows, wherein some of the N rows (for example, M rows, where the M rows are a subset of the N rows) may be rows having relatively low retention characteristics (hereinafter, referred to as weak rows). Here, the M weak rows may be refreshed at least twice every refresh cycle. Address information of weak rows may be generated and stored while testing the memory device 200 during manufacturing. In some examples, address information of weak rows may be generated and stored during operation of the memory device 200.

If each of the M weak rows is refreshed two times within a refresh cycle, N+M refresh commands may be provided from the memory controller 100 to the memory device 200 within the refresh cycle. For example, the memory controller 100 may provide N refresh commands to the memory device 100 to cause the memory device 100 to refresh each of the N rows, and the memory controller 100 may provide M refresh commands to the memory device 100 to cause the memory device 100 to refresh each of the M weak rows. In addition, the refresh controller 220 may perform a supplemental refresh one time on each of the M weak rows, while refreshing the N rows one time in response to the N+M refresh commands. Since the supplemental refresh performs a refresh operation only on certain rows, the supplemental refresh may also be referred to as target refresh.

As described above, the memory device 200 may determine whether to perform a supplemental refresh on at least one row of the memory cell array 210 during a memory operation. In some embodiments, certain rows of the memory cell array 210 may be activated repeatedly, which can cause leakage of the charge stored in the capacitors of neighboring rows. For example, a first row of the memory cell array 210 may be frequently activated, and electric charge stored in capacitors of at least one neighboring row, for example, a second row adjacent to the first row, may leak. In this case, data of the second row may be lost due to the frequent activation of the first row. The second row experiencing data loss due to the frequent activation of the first row may also be referred to as a weak row. Generally, a row having a low data retention characteristic due to frequent activation of another row may be referred to as a disturbed row, which is to be distinguished from a weak row that is determined while testing the memory device 200 (e.g., testing during the manufacturing process). In this application, references to "weak rows" may refer to both disturbed rows (e.g., rows whose data is disturbed by frequent activation of neighboring rows) and rows having memory cells whose structure has been determined to have relatively low data retention characteristics.

For example, when a disturbed row is detected, the memory device 200 may determine that the disturbed row is to be refreshed. According to a result of the determination, the request signal generator 230 may generate and transmit to the memory controller 100 the request signal Req_R requesting the memory controller 100 to output the refresh command such that request-based refresh is performed on the second row before the data of the second row corresponding to a disturbed row is lost.

In some embodiments, the request signal Req_R may be generated by further referring to a result of determining a refresh state inside the memory device 200. For example, a determination is made about the refresh state of the memory device 200 before a disturbed row is detected, and the request signal Req_R may be generated according to a result of the refresh state determination. Alternatively, a refresh state of a disturbed row is determined, and the request signal Req_R may be generated according to a result of the disturbed row determination. Determinations of various conditions may be performed, such as, for example, whether a refresh command is not provided to the memory device 200 for a certain interval before a point of time when the disturbed row is detected, or whether the disturbed row is not refreshed for a certain interval.

Meanwhile, the memory controller 100 may output the refresh command in response to the request signal Req_R from the memory device 200. For example, the memory controller 100 may include a command queue (not shown) therein, and the command queue may store a write/read command according to a request from the host HOST. Also, the command queue may store a refresh command generated in response to the request signal Req_R received from the memory device 200. The scheduler 110 may control an output timing of commands stored in the command queue. For example, the scheduler 110 may control an output timing of a refresh command generated in response to the request signal Req_R. According to control of the scheduler 110, a request-based refresh command may be provided to the memory device 200 such that the rows of the memory cell array 210 are refreshed according to a certain standard (e.g., standards defined by a specification).

According to the above embodiment, since the memory device 200 determines whether to perform a supplemental refresh of a weak row (e.g., a row having high possibility of data loss or a row having a low data retention characteristic) and generates the request signal Req_R requesting the memory controller 100 to output a refresh command based on the desirability for a supplemental refresh, data stability of the memory device 200 may improve. In other words, when determined to be desirable, the memory device 200 provides the request signal Req_R to the memory controller 100 without having to passively wait for a refresh command from the memory controller 100, and upon receipt of the requested refresh signal, performs request-based refresh on weak rows. Accordingly, by performing refresh on the weak rows at appropriate times, the weak rows are prevented from losing data.

Figure 2:
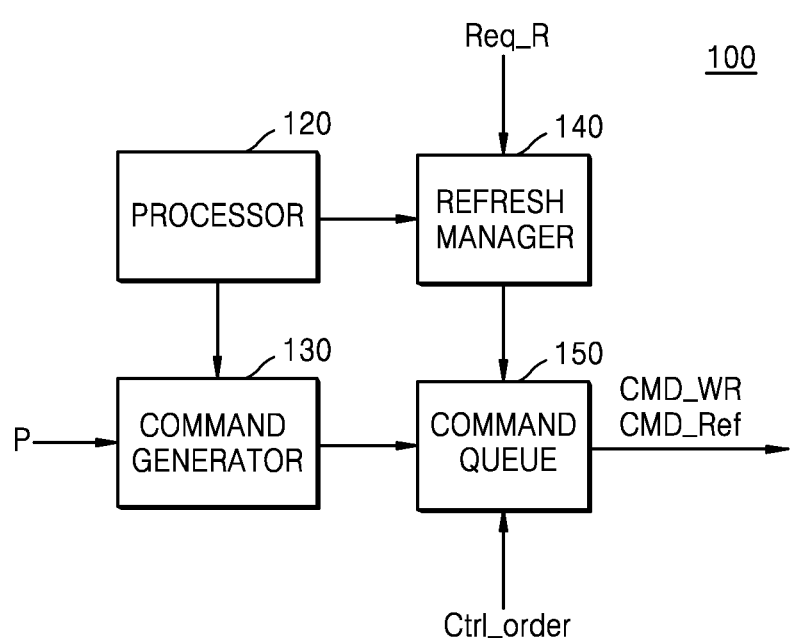
FIG. 2 is a block diagram of a memory controller of FIG. 1, according to an exemplary embodiment.

FIG. 2 is a block diagram of the memory controller 100 of FIG. 1, according to an embodiment.

As shown in FIG. 2, the memory controller 100 may include a processor 120, a command generator 130, a refresh manager 140, and a command queue 150. Although not shown in FIG. 2, the memory controller 100 may further include various functional blocks (e.g., circuitry for performing functionality) for controlling the memory device 200. Also, relationships between functional blocks of the memory controller 100 of FIG. 2 and signal transmission and reception are only examples, and various functions according to embodiments may be performed even if the relationships are modified.

Referring to FIGS. 1 and 2, the processor 120 controls overall operations of the memory controller 100, and accordingly, may control various functional blocks included in the memory controller 100. For example, the processor 120 may control the functions performed by circuitry of the memory controller 100. Also, the command generator 130 may generate a command according to an access request from a host HOST, and for example, may generate a write/read command CMD_WR according to a result of decoding a packet P received from the host HOST.

The refresh manager 140 manages refresh operations such that memory cells of the memory cell array 210 are all refreshed within certain refresh cycles, and for example, may generate a plurality of refresh commands CMD_Ref for refreshing all of the memory cells of the memory cell array 210 within a refresh cycle. If the memory cell array 210 includes a plurality of banks and the refresh operations are managed according to banks, the refresh manager 140 may further generate a bank address.

The write/read command CMD_WR received from the command generator 130 and the refresh command CMD_Ref received from the refresh manager 140 may be stored in the command queue 150. The command queue 150 may sequentially store the write/read command CMD_WR and the refresh command CMD_Ref according to a received order. For example, the command queue 150 may store the write/read command CMD_WR and the refresh command CMD_Ref in the order received from the command generator 130 and refresh manager 140, respectively. Meanwhile, outputting of commands stored in the command queue 150 may be adjusted according to an order control signal Ctrl_order. The order control signal Ctrl_order may be generated by the scheduler 110.

According to an embodiment, the refresh manager 140 may receive the request signal Req_R from the memory device 200, and generate the refresh command CMD_Ref in response to the request signal Req_R. Also, the scheduler 110 may adjust an output timing of the refresh command CMD_Ref in response to the request signal Req_R. According to an embodiment, even when the refresh command CMD_Ref based on the request signal Req_R is stored in the command queue 150 later than the write/read command CMD_WR, the refresh command CMD_Ref may be output before the write/read command CMD_WR based on the order control signal Ctrl_order.

Figure 3:
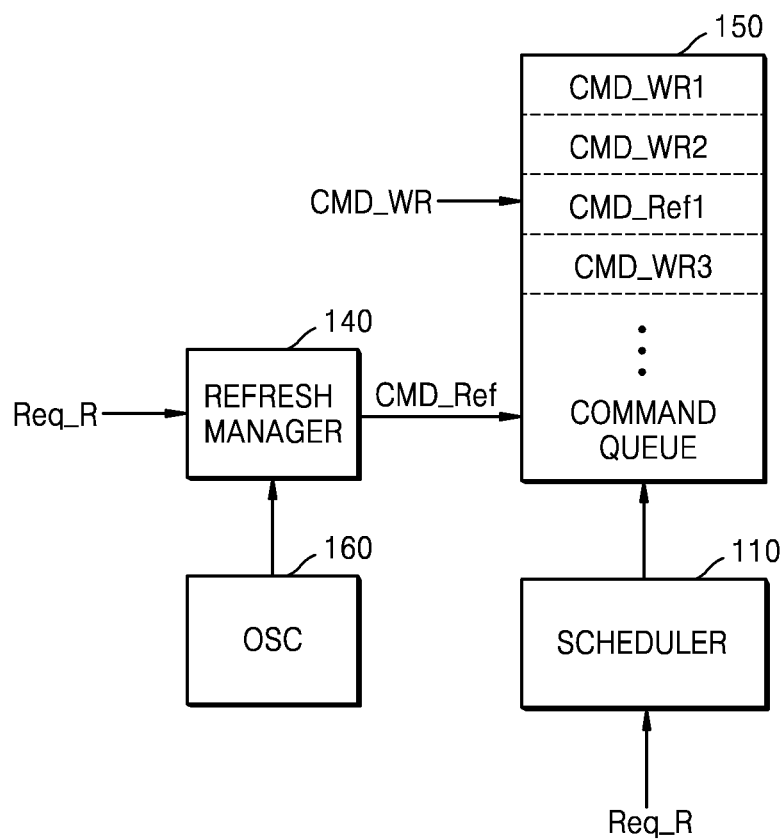
FIG. 3 is a block diagram for describing an example of a detailed operation of the exemplary memory controller of FIG. 1.

FIG. 3 is a block diagram for describing an example of a detailed operation of the memory controller 100 of FIG. 1. As shown in FIG. 3, the memory controller 100 may further include an oscillator 160 configured to generate a signal (for example, a pulse signal) indicating a generating timing of a refresh command. However, a structure of the memory controller 100 of FIG. 3 is only an example, and the oscillator 160 may be provided outside of the memory controller 100, and the pulse signal may be provided to the memory controller 100 from the oscillator 160.

The refresh manager 140 may generate the refresh command CMD_Ref based on a signal from the oscillator 160. Also, the refresh manager 140 may further generate the refresh command CMD_Ref based on the request signal Req_R received from the memory device 200. According to an embodiment, the command queue 150 may store a plurality of write/read commands CMD_WR (e.g., CMD_WR1, CMD_WR2, CMD_WR3, etc.) and a refresh command CMD_Ref1.

The scheduler 110 may adjust an output timing of commands stored in the command queue 150 by generating the order control signal Ctrl_order. For example, the scheduler 110 may generate the order control signal Ctrl_order based on the request signal Req_R. In FIG. 3, the request signal Req_R is provided to the scheduler 110, but an embodiment is not limited thereto. For example, the refresh manager 140 may generate the refresh command CMD_Ref1 based on the request signal Req_R, and provide information indicating a generation of the refresh command CMD_Ref1 to the scheduler 110. For example, the scheduler 110 may generate the order control signal Ctrl_order based on the information received from the refresh manager 140.

The commands stored in the command queue 150 may be output to the memory device 200 based on the order control signal Ctrl_order. According to an embodiment, a time consumed for the memory device 200 to provide the request signal Req_R to the memory controller 100 and for the memory controller 100 to actually output the refresh command CMD_Ref1 may be a predetermined time (and may be defined by a specification). For example, the delay between the time the memory device 200 provides the request signal Req_R and the time the memory controller 100 outputs the refresh command CMD_Ref1 may be predetermined (e.g., set according to the specification). The memory device 200 may provide the request signal Req_R to the memory controller 100 by taking into account the specification. The memory controller 100 may also adjust the output timing of the refresh command CMD_Ref1 such that the specification is satisfied. For example, the refresh command CMD_Ref1 may be output to the memory device 200 before the write/read commands CMD_WR1 through CMD_WR3, which are stored in the command queue 150, based on the order control signal Ctrl_order.

Figure 4:
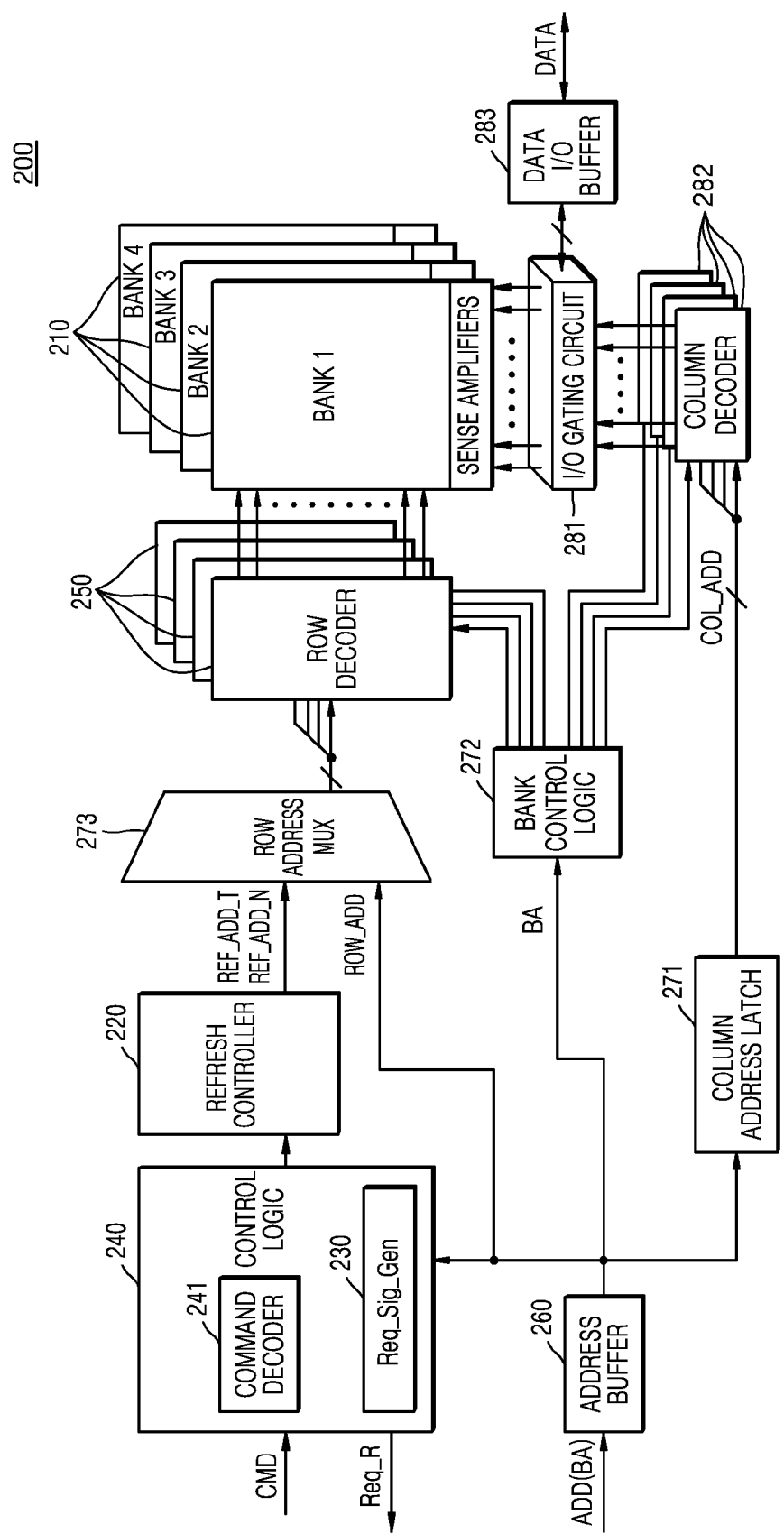
FIG. 4 is a block diagram of a memory device of FIG. 1, according to an exemplary embodiment.

FIG. 4 is a block diagram of the memory device 200 of FIG. 1, according to an exemplary embodiment. The memory device 200 of FIG. 4 is only an example, and thus a structure of the memory device 200 may vary. Also, in FIG. 4, the memory cell array 210 includes four banks (e.g., BANK1, BANK2, BANK3, and BANK4). However, the memory cell array 210 may include more banks. The structure and operations of the memory device 200 of FIG. 4 will now be described with reference to FIGS. 1 through 4.

The memory device 200 may include at least one memory chip, and the memory device 200 of FIG. 4 may show a structure of any memory chip. The memory device 200 may include the memory cell array 210, the refresh controller 220, the request signal generator 230, and control logic 240. In FIG. 4, the request signal generator 230 is included in the control logic 240, but an embodiment is not limited thereto, and the request signal generator 230 may be provided outside the control logic 240. The control logic 240 may be circuitry configured to perform the operations described and disclosed herein.

For memory operations, the memory device 200 may further include other various components. For example, the memory device 200 may further include row decoders 250 and column decoders 282 for respectively selecting a row and a column of the memory cell array 210, an address buffer 260 for storing the address ADD received from an external source, a column address latch 271 for temporarily storing a column address, a bank control logic 272 for controlling the first through fourth banks BANK1 through BANK4 of the memory cell array 210 according to a bank address BA, and a row address multiplexer 273 for selectively outputting a normal row address and a refresh address. Also, the memory device 200 may further include an input/output (I/O) gating circuit 281 performing gating of data DATA, and a data I/O buffer 283 via which the data DATA is input or output.

The memory device 200 may be dynamic random access memory (DRAM), such as double data rate synchronous dynamic random access memory (DDR SDRAM), low power double data rate (LPDDR) SDRAM, graphics double data rate (GDDR) SDRAM, or rambus dynamic random access memory (RDRAM). Meanwhile, according to another embodiment, the memory device 200 may be an arbitrary memory device that requires a refresh operation. For example, when a resistive memory device, as a non-volatile memory, performs a refresh operation, the memory device 200 according to an embodiment may be a non-volatile memory.

The control logic 240 may control overall operations of the memory device 200. In some embodiments, the control logic 240 may include a command decoder 241. The control logic 240 may generate control signals such that write/read operations are performed according to a request from a host, based on a decoding result. Also, the control logic 240 may control the refresh controller 220 such that a refresh operation is performed on the memory cell array 210 according to a refresh command received from the memory controller 100.

The address buffer 260 may receive the address ADD provided from the memory controller 100. As described above, the address ADD may include the bank address BA (denoted in FIG. 4 as ADD(BA)). Also, the address ADD may include a row address ROW_ADD for directing a row of the memory cell array 210 and a column address COL_ADD for directing a column of the memory cell array 210. The row address ROW_ADD may be provided to the row decoder 250 through the row address multiplexer 273, and the column address COL_ADD may be provided to the column decoder 282 through the column address latch 271. Also, the bank address BA may be provided to the bank control logic 272.

The refresh controller 220 may generate a refresh address for selecting a row on which refresh is to be performed in the memory cell array 210. For example, the refresh controller 220 may include a counter (not shown) therein, and may sequentially select the plurality of rows included in the memory cell array 210 by performing a counting operation whenever a refresh command is received from the memory controller 100. An address generated based on the counting operation is related to a normal refresh operation, and may be referred to as a normal refresh address REF_ADD_N. For example, for normal refresh operations, the refresh controller 220 may generate a normal refresh address REF_ADD_N and a counter may maintain a count of the number of normal refresh operations performed on the normal refresh address REF_ADD_N.

Meanwhile, the refresh controller 220 may generate a target refresh address REF_ADD_T, which is related to the performing of target refresh. For example, the refresh controller 220 may store address information for target refresh of at least one weak row, and may generate a target refresh address REF_ADD_T for supplemental refresh of the at least one weak row according to certain cycles. In some embodiments, after a normal refresh is performed a plurality of times, a target refresh may be performed on at least one weak row included in the stored address information.

Also, a target refresh may include request-based refresh according to certain exemplary embodiments. For example, the memory device 200 may determine whether to perform request-based refresh on at least one row, and the refresh controller 220 may generate the target refresh address REF_ADD_T according to a result of the determination.

The row address multiplexer 273 may be include a multiplexer, and the row address multiplexer 273 may output the row address ROW_ADD provided from the memory controller 100 during a data access, and output the normal refresh address REF_ADD_N and the target refresh address REF_ADD_T generated by the refresh controller 220 during a refresh operation.

According to control of the refresh controller 220, each of all the rows of the memory cell array 210 may be refreshed one time according to the normal refresh address REF_ADD_N during certain refresh cycles. Also, a target refresh including request-based refresh according to one or more embodiments may be further performed within the certain refresh cycles, and some weak rows of the memory cell array 210 may be refreshed at least one additional time based on the target refresh address REF_ADD_T.

Since the control logic 240 performs various control operations according to the command CMD and the address ADD received from the memory controller 100, the control logic 240 may determine various refresh states related to refresh in the memory device 200. For example, when a memory operation is performed, a new weak row may be detected, and a state of a refresh operation performed by the memory device 200 may be determined during a certain interval before a point of time when the weak row is newly detected. Additionally, a point of time when at least one row detected as a weak row is last refreshed may be determined. Also, the control logic 240 may determine a refresh state of each weak row, for example, whether each weak row is refreshed at least one time during a certain time interval.

Based on a result of determinations of the refresh states, the request signal generator 230 may generate the request signal Req_R. A refresh command generated in response to the request signal Req_R may be provided to the control logic 240, and the refresh controller 220 may perform a target refresh (or request-based refresh) on at least one weak row according to the refresh command.

Figure 5:
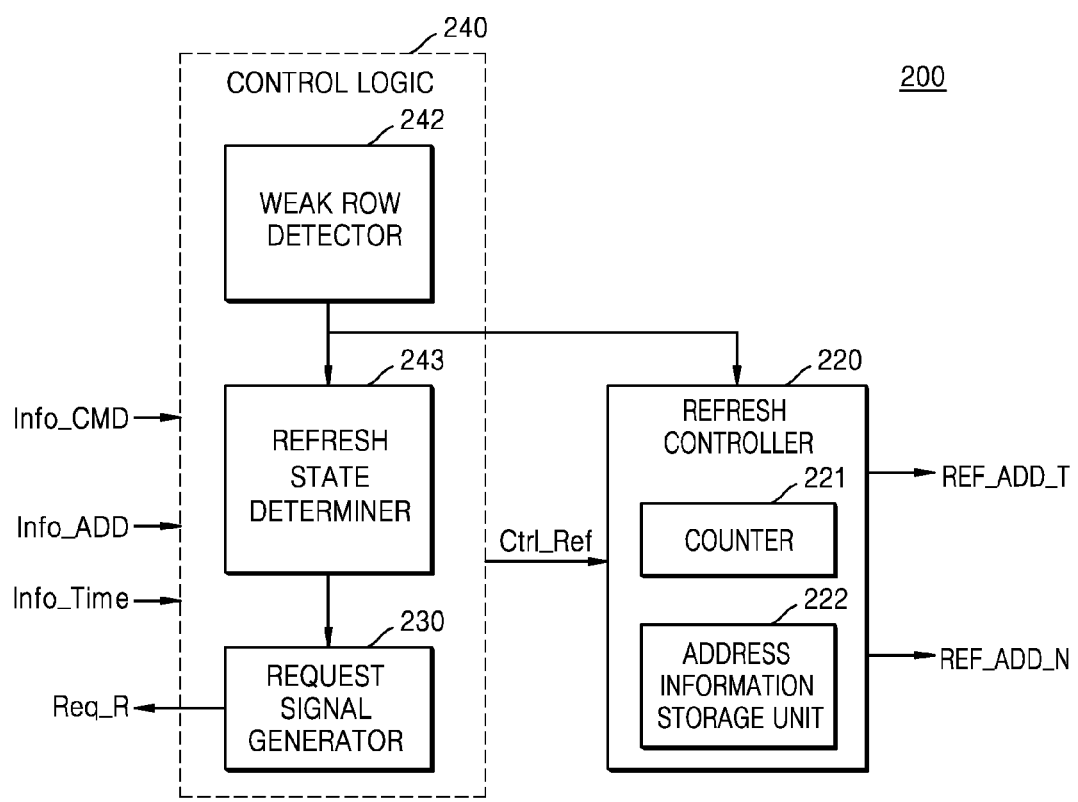
FIG. 5 is a block diagram of components related to a refresh operation, according to an exemplary embodiment.

FIG. 5 is a block diagram of components for performing a refresh operation, according to an exemplary embodiment. As shown in FIG. 5, the memory device 200 may include a weak row detector 242, a refresh state determiner 243, the request signal generator 230, and the refresh controller 220. The weak row detector 242 and the refresh state determiner 243 of FIG. 5 may be provided inside or outside the control logic 240. The control logic 240 may be circuitry for performing the operations described herein.

The weak row detector 242 may detect at least one new row for a target refresh during an operation of the memory device 200. For example, the weak row detector 242 may provide address information of at least one row on which target refresh is to be newly performed. Referring to an example of 1-row disturb, the weak row detector 242 may determine a location of a row that is frequently activated, detect at least one row adjacent to the frequently activated row as a weak row (or a disturbed row), and provide address information of the at least one weak row to the refresh controller 220.

Meanwhile, the refresh state determiner 243 may determine a state of refresh performed by the memory device 200, or determine a refresh state of a detected weak row. For example, when at least one weak row is detected by the weak row detector 242, a refresh state of the memory device 200 and/or the at least one weak row during a certain time interval before a point of time when the at least one weak row is detected may be determined. Based on a result of determining the refresh state, the request signal generator 230 may generate the request signal Req_R when a possibility of the at least one weak row losing data is relatively high, and may not generate the request sign Req_R when the possibility of the at least one weak row losing data is not relatively high and/or relatively low. The possibility of the at least one weak row losing data may be determined based on previously-defined threshold values. For example, a specification corresponding to the memory device 200 may identify one or more threshold values, indicating the possibility of data loss occurring. In some embodiments, determining whether the at least one row is a weak row may be determined by measuring at least one of a voltage and a current of the plurality of rows, and detecting at least one row as the weak row having a low leakage characteristic based on the results of the measuring. In some embodiments, the measuring may occur in real-time during operation of the memory device 200.

The refresh controller 220 may refresh at least one row in response to a refresh control signal Ctrl_Ref received from the control logic 240. For example, the refresh controller 220 may include a counter 221 and an address information storage unit 222. The counter 221 may generate the normal refresh address REF_ADD_N that corresponds to the performance of normal refresh based on a counting operation. The refresh controller 220 may generate the target refresh address REF_ADD_T according to an address stored in the address information storage unit 222 at a time when a target refresh is performed. Also, request-based refresh may be performed according to certain exemplary embodiments, and the refresh controller 220 may generate the target refresh address REF_ADD_T corresponding to address information received from the weak row detector 242 during the request-based refresh.

Such detecting and determining operations may be performed in the memory device 200 using various signals. For example, command-related information Info_CMD, address-related information Info_ADD, and time-related information Info_Time may be used. At least one weak row may be detected based on the command-related information Info_CMD and the address-related information Info_ADD, and a refresh state of the memory device 200 and/or the weak row may be determined by further using the time-related information Info_Time.

Figure 6:
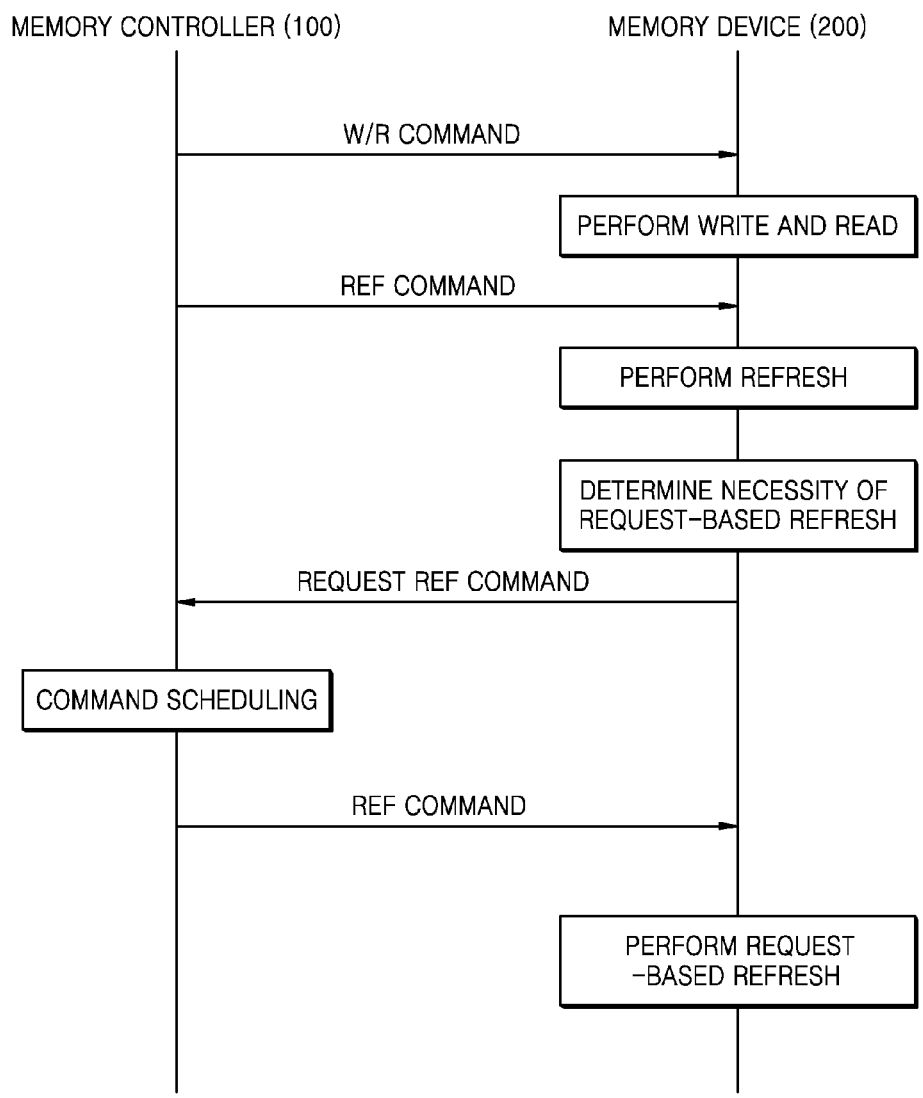
FIG. 6 is a conceptual diagram of an operation of a memory system, according to an exemplary embodiment.

FIG. 6 is a conceptual diagram of an operation of a memory system, according to an exemplary embodiment.

Referring to FIG. 6, the memory controller 100 provides a write/read command W/R to the memory device 200 according to a request from the host HOST. The memory device 200 may perform writing and reading operations in response to the write/read command W/R.

Also, the memory controller 100 provides a refresh command REF to the memory device 200 such that all rows of the memory device 200 are refreshed within one refresh cycle. The memory device 200 performs refresh on all rows of a memory cell array in response to the refresh command REF. The refresh may include a normal refresh based on a counting operation and a target refresh corresponding to information of some weak rows, which are a subset of all the rows.

The memory device 200 may determine whether request-based refresh is to be performed on at least one certain row. The determining may include various operations described above, and for example, may include an operation of determining whether the at least one certain row is frequently activated. Based on a result of the determining, the memory device 200 may request the memory controller 100 to perform refresh on the at least one certain row (or a weak row). In some embodiments, the memory device 200 may request the memory controller 100 to perform refresh on one or more rows adjacent to the at least one certain row (e.g., at least one disturbed row). As an example of requesting to perform refresh, the memory device 200 may generate a request signal (i.e., request refresh command) requesting the memory controller 100 to output a refresh command, and provide the request signal to the memory controller 100.

In response to the request signal, the memory controller 100 generates the refresh command REF, and provides the refresh command REF to the memory device 200 according to a command scheduling of the write/read command W/R and the refresh command REF. The memory device 200 may perform the request-based refresh in response to the refresh command REF. For example, the request-based refresh may correspond to a target refresh of at least one weak row.

Figure 7:
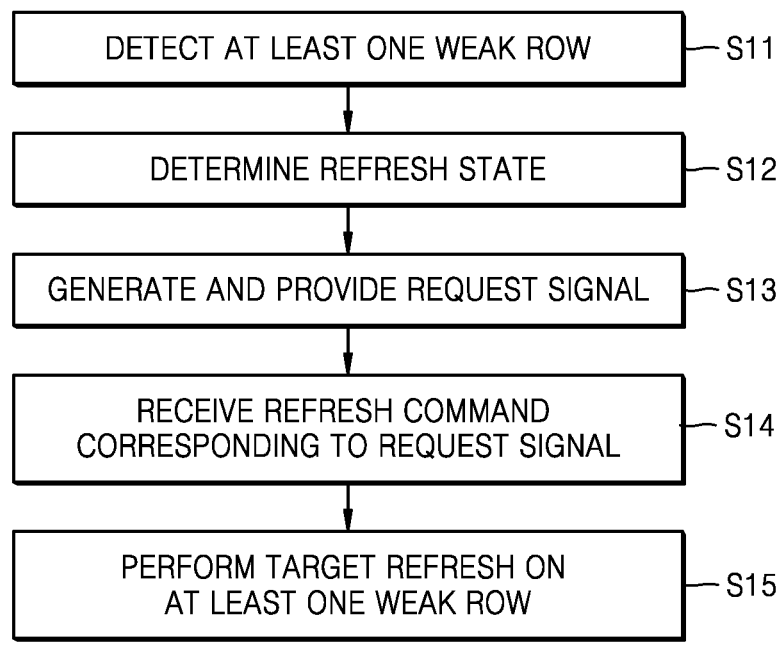
FIG. 7 is a flowchart of an operating method of a memory device, according to an exemplary embodiment.

FIG. 7 is a flowchart of an operating method of a memory device, according to an embodiment.

Referring to FIG. 7, the memory device 200 may detect at least one weak row, in operation S11. The weak row may be detected by referring to address information of a row that is determined as a weak row during an initial test process of the memory device. Alternatively, the weak row may be a row newly-detected to have a low data retention characteristic during an operation of the memory device.

Then, the memory device 200 may determine a refresh state of the memory device 200 and/or the weak row, in operation S12. For example, it may be determined whether the memory device 200 did not perform refresh or performed refresh only a few times during a certain interval. Alternatively, it may be determined whether refresh is not performed on the weak row at least a certain set value based on a point of time when the weak row is detected. Based on results of such detecting and determining, it may determined whether request-based refresh is to be performed.

The memory device 200 may generate a request signal requesting a memory controller 100 to output a refresh command based on the result of the determining, and provide the request signal to the memory controller 100, in operation S13. The memory device 200 receives a refresh command generated by the memory controller 100 in response to the request signal, in operation S14. The memory device 200 performs a target refresh (or request-based refresh) on the at least one weak row in response to the refresh command, in operation S15.

Figure 8A:
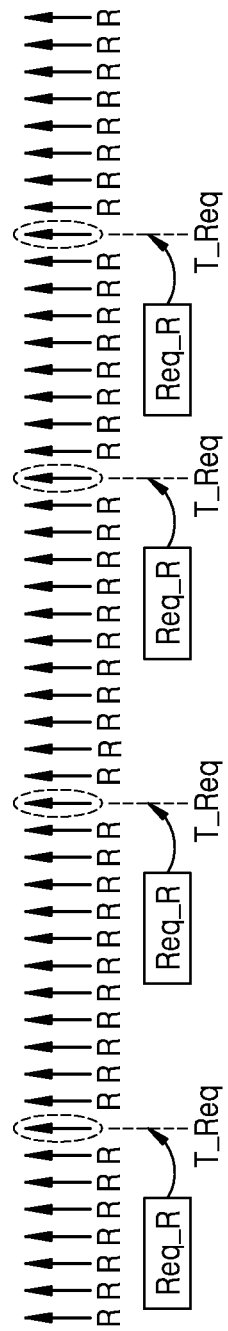
FIGS. 8A and 8B illustrate examples of performing request-based refresh via various methods, according to certain exemplary embodiments.
Figure 8B:
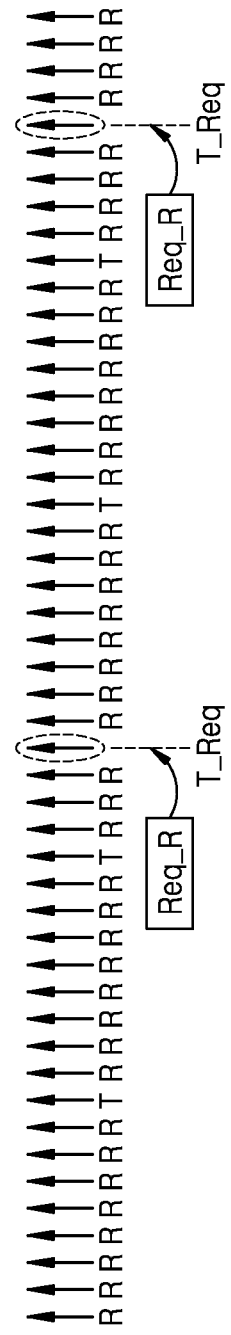

FIGS. 8A and 8B illustrate examples of performing request-based refresh via various methods, according to certain exemplary embodiments.

Referring to FIG. 8A, a memory device 200 may perform normal refresh R in response to a refresh command from a memory controller 100. Also, the memory device 200 may self-determine target refresh desirability of some rows, and generate and provide the request signal Req_R to the memory controller 100 according to a result of the self-determination. Accordingly, request-based refresh T_Req may be non-periodically added while performing the normal refresh R. For example, in response to a request signal Req_R sent from the memory device 200 to the memory controller 100 and corresponding response from the memory controller 100, request-based refresh T_Req may be performed in addition to, and in between, normal refresh R operations.

Meanwhile, referring to FIG. 8B, the memory device 200 may pre-store address information of weak rows through a test process of the memory device, and a target refresh of the weak rows may be added according to a certain cycle. In some embodiments, when the memory device 200 pre-stores address information of weak rows, a target refresh operation may be performed periodically. For example, target refresh T may be performed one time whenever the normal refresh R is performed 8 times.

The request-based refresh T_Req may be added to the target refresh T according to an exemplary embodiment. If it is determined that request-based refresh needs to be performed on a certain row, the request-based refresh T_Req may be performed even when the normal refresh R is performed less than 8 times, thereby performing target refresh on the certain row. For example, the request-based refresh T_Req may be performed and then the normal refresh R may be performed again 8 times and the target refresh T may be performed one time. Then, when the request-based refresh T_Req needs to be performed again, the request-based refresh T_Req may be performed without regard to the number of times the normal refresh R is performed.

Figure 9A:
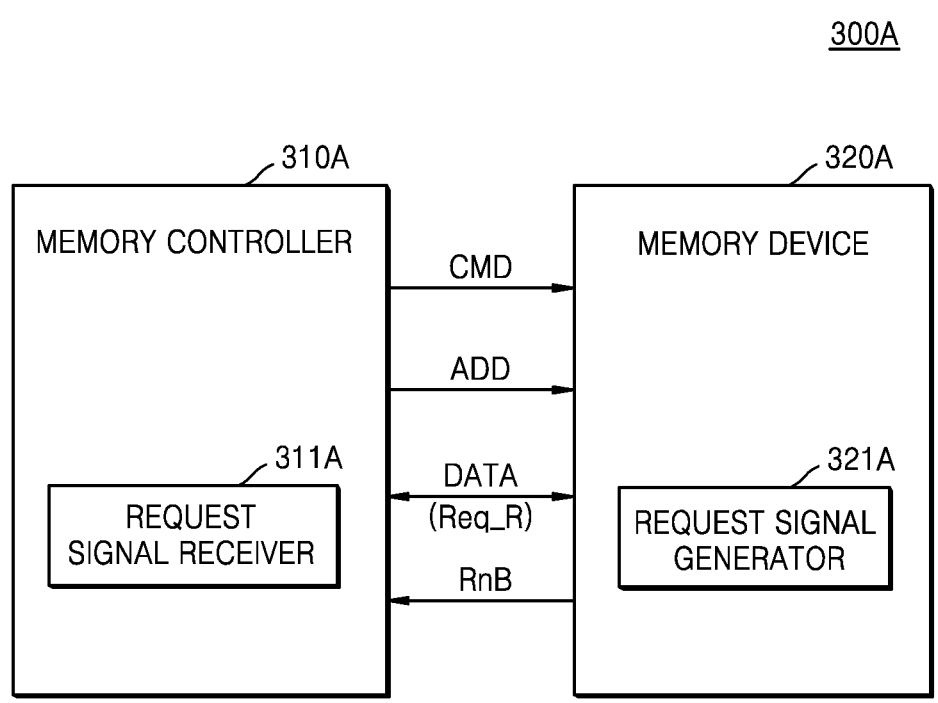
FIGS. 9A and 9B are block diagrams of a memory system having various channels for transmitting a request signal, according to certain exemplary embodiments.
Figure 9B:
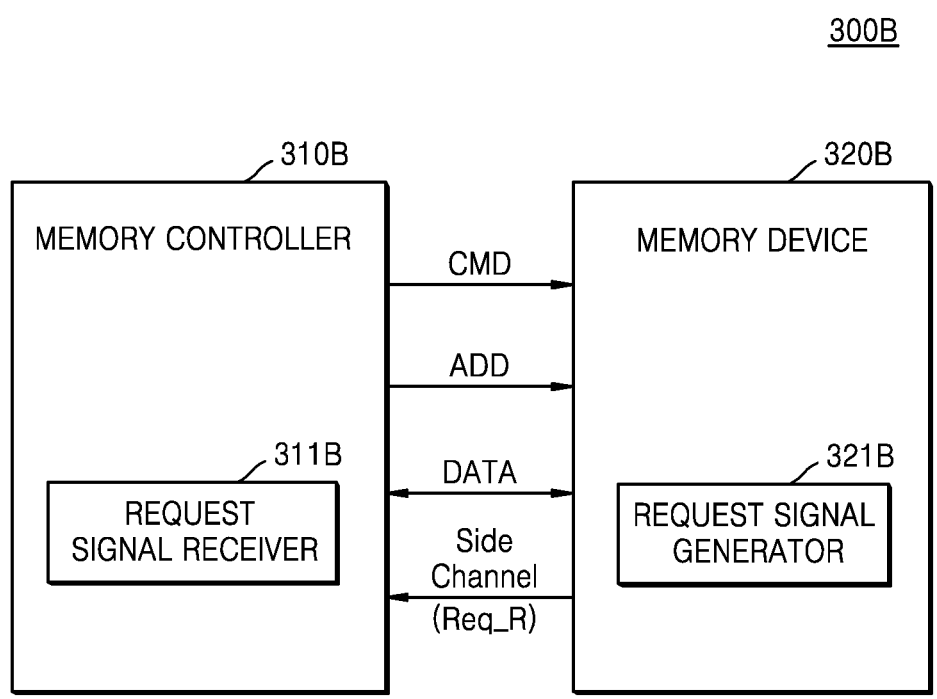

FIGS. 9A and 9B are block diagrams of memory systems 300A and 300B having various channels for transmitting a request signal, according to certain exemplary embodiments.

Referring to FIG. 9A, the memory system 300A includes a memory controller 310A and a memory device 320A. The memory controller 310A may include a request signal receiver 311A, and the memory device 320A may include a request signal generator 321A.

The memory controller 310A and the memory device 320A transmit and receive various signals through a plurality of channels. For example, the memory controller 310A may provide the command CMD to the memory device 320A through a command channel, and provide the address ADD to the memory device 320A through an address channel. The memory controller 310A and the memory device 320A may transmit and/or receive the data DATA through a data channel. Also, the memory device 320A may provide a ready/busy signal RnB to the memory controller 310A through a separate channel. The memory controller 310A may not provide the command CMD or the address ADD to the memory device 320A when the ready/busy signal RnB includes information indicating a busy state (e.g., logic low).

The memory device 320A may output the request signal Req_R through any existing channel. For example, when the ready/busy signal RnB has a value of logic low, indicating a busy state, at least one of the command, address, and data channels is not used, and the request signal Req_R may be provided to the memory controller 310A by using one of the unused command, address, and data channels. In addition, the memory controller 310A and the memory device 320A may include a channel for transferring various types of information related to a memory operation, and the request signal Req_R may be provided through any one of existing channels, which is not used during an output time.

Meanwhile, referring to FIG. 9B, the memory system 300B includes a memory controller 310B and a memory device 320B. The memory controller 310B may include a request signal receiver 311B, and the memory device 320B may include a request signal generator 321B. In FIG. 9B, the request signal Req_R is provided from the memory device 320B to the memory controller 310B through a separate channel, for example, a side channel.

Figure 10A:
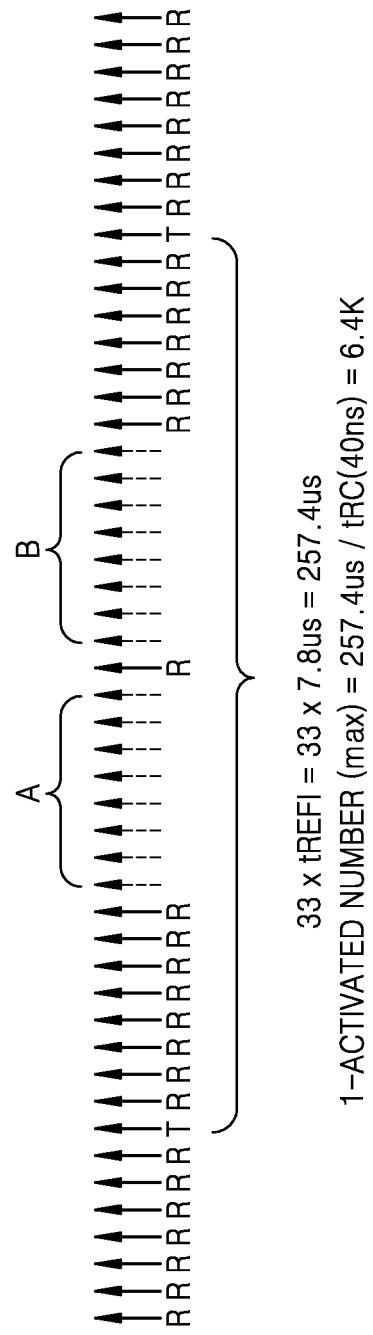
FIGS. 10A and 10B illustrate examples of applying request-based refresh according to an exemplary embodiment to a disturbed row.
Figure 10B:
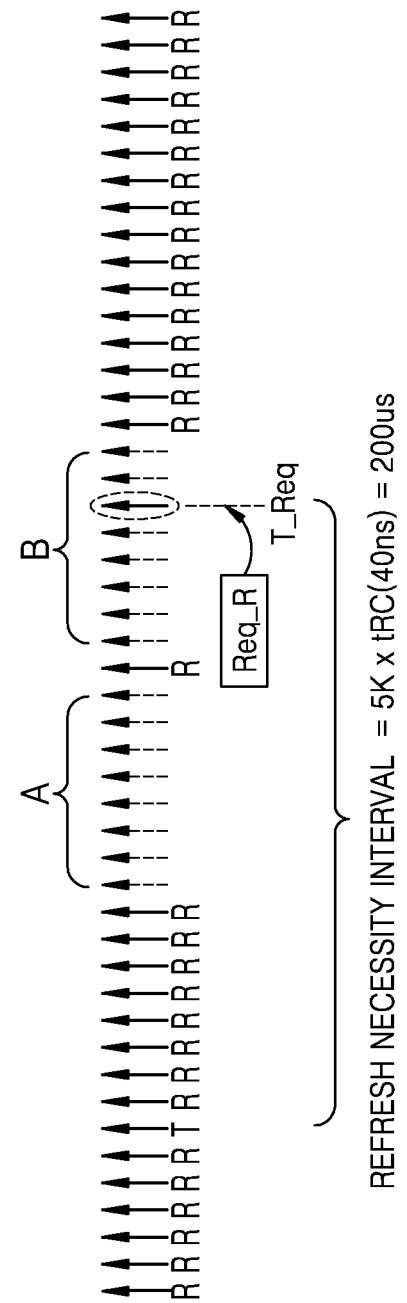

FIGS. 10A and 10B illustrate examples of applying request-based refresh to a disturbed row. In FIG. 10A, request-based refresh is not applied, whereas in FIG. 10B, request-based refresh is applied.

When a certain row is frequently activated in a memory device, at least one row adjacent to the certain row may be disturbed, and thus data of the at least one adjacent row (hereinafter, referred to as a disturbed row) may be lost. For convenience of description, it is assumed that only one row adjacent to the certain row is detected as a disturbed row. Also, a limit value for the disturbed row to normally maintain the data when the certain row is frequently activated may be defined by a specification. For example, a limit value of an activated number may be pre-defined to be 5,000 times in a device specification. The limit value may be a threshold value that, when exceeded, results in a row being identified as a frequently or intensively activated row.

Referring to FIG. 10A, a memory controller may provide a plurality of refresh commands to a memory device within one refresh cycle. The memory device may perform the normal refresh R in response to the refresh commands, or perform the target refresh T on at least one weak row. The target refresh T may be performed in accordance with a device specification. For example, in FIG. 10A, the target refresh T is performed one time after the normal refresh R is performed 16 times. In some exemplary embodiments, the target refresh T is performed on disturbed rows.

During an operation of a memory system, there may be an interval A in which the memory controller does not output a refresh command. The interval A may be preceded by a period during which the memory controller intensively outputs refresh commands. In some embodiments, the term intensively output may, for example, refer to a number of times the memory controller outputs refresh commands within a certain time period. Also, there may be an interval B in which the memory controller does not output a refresh command as outputting of a refresh command is delayed, and delayed refresh commands may be intensively output after the interval B has passed. Referring to FIG. 10A, it is assumed that an interval of each of the intervals A and B in which a refresh command is not output corresponds to an interval in which refresh commands can be output by the memory controller 8 times. When a reception interval tREFI of refresh commands corresponds to 7.8 μs (i.e., a time consumed for the target refresh T to be performed), the normal refresh R to be performed 16 times, and then the target refresh T can be performed may be 257.4 μs at most. For example, after the target refresh T preceding the interval A, the normal refresh R may be performed a total of 33 times, resulting in a total time of 257.4 μs during which the target refresh T may be performed.

Meanwhile, an interval for one row to be activated and then a next row to be activated from among a plurality of rows of a memory cell array (e.g., RC delay tRC) may be defined by a specification. For example, the RC delay tRC may be 40 ns. If one row (e.g., a first row) is continuously activated during an interval in which the target refresh T is not performed, the first row may be activated 6,400 times (i.e., 257.4 μs/40 ns=6.4 k). In this case, a limit value (e.g., 5,000 times) of the first row is exceeded, but at least one row (e.g., a second row) adjacent to the first row may not be refreshed while the first row is activated 6,400 times. In FIG. 10A, during the interval when the target refresh T is not performed, request-based refresh also is not performed on the second row even when the first row is activated by at least the limit value, and data of the second row is likely to be lost.

Referring to FIG. 10B, the memory device may determine whether to refresh some rows, and perform the request-based refresh T_Req on at least one weak row based on a result of the determining. According to the request-based refresh T_Req, the memory device may perform refresh on the at least one weak row before data is lost. Although the discussion related to FIG. 10B refers to weak rows, the disclosed embodiments may be applied to weak and/or disturbed rows. For example, the disclosed embodiments may be applied to weak rows that are also disturbed rows.

For example, a refresh command may not be provided from the memory controller during at least one of the intervals A and B after the target refresh T is performed (i.e., illustrated in FIG. 10B as the target refresh T preceding the interval A). Accordingly, a long time may pass before the target refresh T is performed again after the normal refresh R is performed 16 times.

According to an embodiment, the memory device may count an activated number of the rows included in the memory cell array, and compare the activated number and a set value. For example, the memory device may keep a count of the number of times each row (e.g., first row) in the memory cell array is activated. When the data of adjacent rows (e.g., second row) may be lost if the first row is activated more than the limit value (e.g., 5,000 times), the set value compared with the activated number may be determined by taking into account the limit value. The set value and the limit value may be predefined threshold values that are determined in order to identify one or more rows at risk of losing data and initiating refresh before the data is lost. The set value may be smaller than the limit value (e.g., 4,000 times) in order to take into account time durations during which a request signal is transmitted or provided to the memory controller and a refresh command is transmitted or provided to the memory device.

For example, when the first row is activated at least 4,000 times (e.g., the activated number is exceed 4,000), the second row may be detected as a disturbed row, and the request signal Req_R may be generated and provided to the memory controller according to a result of the detecting. The memory controller may generate a refresh command in response to the request signal Req_R, and the memory device may perform the request-based refresh T_Req on the second row in response to the refresh command. According to the request-based refresh T_Req, refresh may be performed on the second row before the activated number of the first row exceeds 5,000 times, and thus the data of the second row is prevented from being lost. For example, when the shortest time the first row is activated 5,000 times is 200 μs, the memory device may generate the request signal Req_R before 200 μs have passed after the first row is activated while performing the request-based refresh T_Req on the second row.

Hereinafter, various examples of determining request-based refresh are determined according to one or more embodiments.

Figure 11:
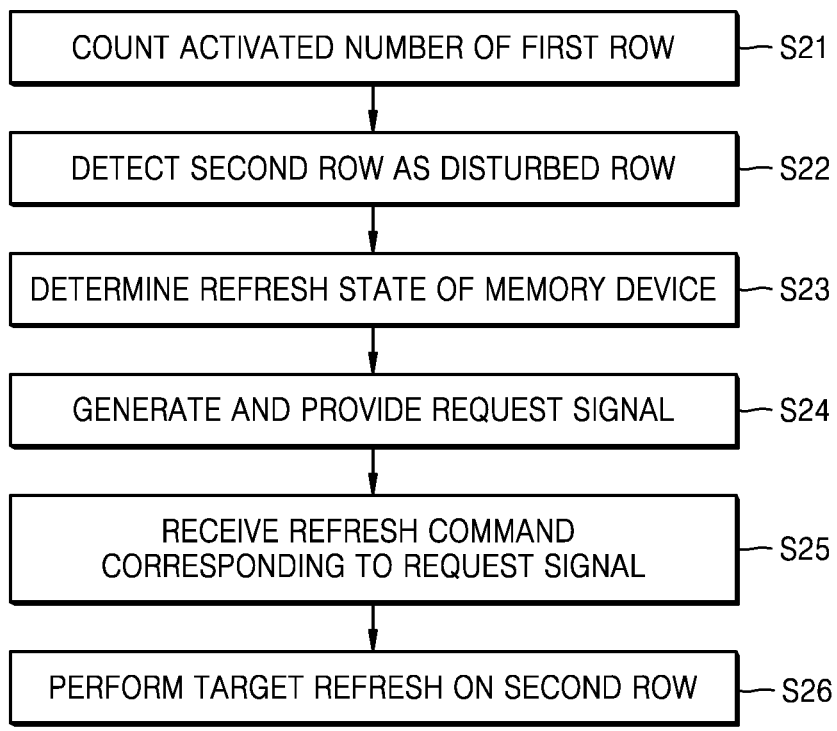
FIG. 11 is a flowchart of an operating method of a memory device, according to another exemplary embodiment.

FIG. 11 is a flowchart of an operating method of a memory device, according to an exemplary embodiment.

Specifically, FIG. 11 describes an example of a second row adjacent to a first row being disturbed as the first row is frequently activated.

Referring to FIG. 11, as a memory operation is performed an activated number of a plurality of rows (e.g., a number of activations of one or more first rows) may be counted in operation S21. According to a result of the counting, when the activated number of the first row is equal to or higher than a set value, at least one row adjacent to the first row (e.g., one or more second rows) may be detected (or determined) as a disturbed row, in operation S22.

When the second row is detected as the disturbed row as described above, a refresh state of a memory device is determined in operation S23, and a request signal requesting a memory controller to output a refresh command may be generated and provided to the memory controller in operation S24 according to a result of the determining. For example, when the memory device determines that the one or more second rows are disturbed rows, the memory device may send one or more request signals, corresponding to one of the one or more second rows, to request the memory controller to send to the memory device refresh commands corresponding to each of the one or more second rows.

In operation S25, the memory device receives a refresh command generated based on the request signal from the memory controller. In some embodiments, when the memory device sends more than one request signal, respectively corresponding to more than one second row that is determined to be a disturbed row, the memory device may receive more than one refresh command, each refresh command corresponding to a unique one of the rows determined to be disturbed rows. Also, the memory device may perform request-based refresh in response to the refresh command in operation S26, and the request-based refresh may correspond to target refresh for refreshing the second row.

Figure 12:
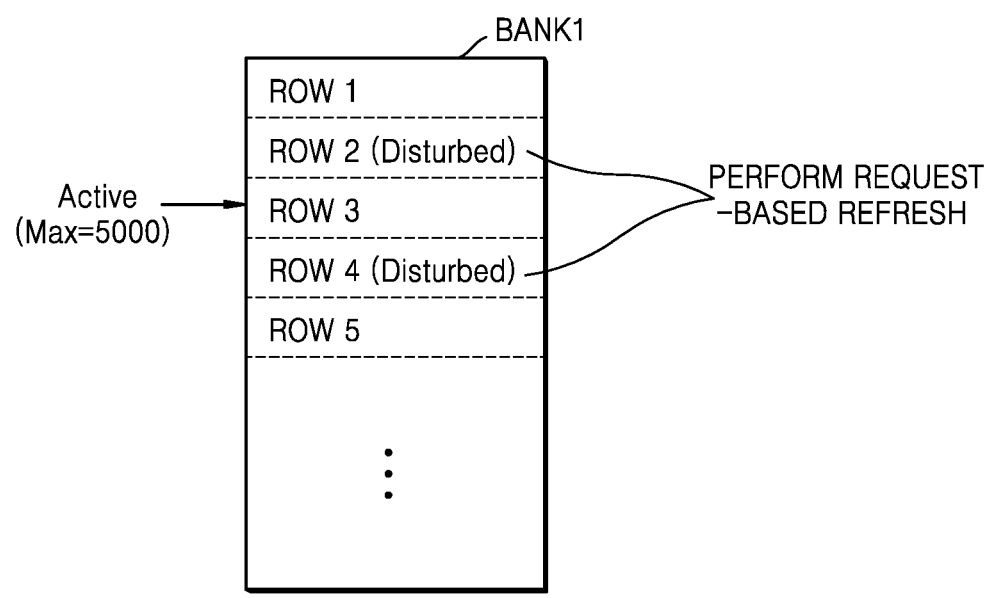
FIG. 12 is a block diagram of an example of performing request-based refresh on at least two disturbed rows.

FIG. 12 is a block diagram of an exemplary embodiment of performing request-based refresh on at least two disturbed rows. In FIG. 12, a first row is frequently activated (e.g., ROW3), and two second rows are determined to be disturbed (e.g., ROW2 and ROW4).

Referring to FIG. 12, one bank, for example, the first bank BANK1, may include a plurality of rows. When a first row ROW3 from among the plurality of rows is frequently activated and an activated number of the third row ROW3 exceeds a limit value (e.g., 5,000 times), data of adjacent second and fourth rows ROW2 and ROW4 that are disturbed may be lost. As discussed above, a limit value of the activated number may be pre-defined by a specification. For example, when a certain row is continuously or discontinuously activated 5,000 times, data of a row adjacent to the certain row may be lost. As another example, when the certain row is intensively activated 5,000 times during a certain time interval, the data of the adjacent row may be lost.

A set value having a certain value based on or relative to the limit value (i.e., a set value of 4,000 times when the limit value is 5,000 times) may be compared with the activated number of the third row ROW3. At least one row may be detected as a disturbed row based on a result of counting an activated number of the rows of the first bank BANK1. If the activated number of the third row ROW3 of the first bank BANK1 is equal to or higher than the set value (e.g., when the activated number is equal to or greater than 4,000 times), the second and fourth rows ROW2 and ROW4 adjacent to the third row ROW3 may be detected as or determined to be disturbed rows.

In order to determine whether request-based refresh is to be performed on the rows ROW2 and ROW4 (e.g., the second rows adjacent to first row ROW1), refresh characteristics of a memory device and/or the rows ROW2 and ROW4 may be determined. According to a result of the determining, a request signal may (e.g., Req_R) be provided to a memory controller, and the memory controller may output a refresh command (e.g., CMD_Ref) in response to the request signal. According to an embodiment, the memory device may sequentially refresh the rows ROW2 and ROW4 based on the refresh command. For example, the rows ROW2 and ROW4 may be refreshed sequentially in response to one refresh command. Alternatively, according to an embodiment, the memory device may continuously provide at least two request signals based on the result of the determining, and refresh at least two rows (for example, the rows ROW2 and ROW4) by using at least two refresh commands provided in response to the at least two request signals.

Meanwhile, according to an embodiment, the activated numbers of the plurality of rows included in the first bank BANK1 may be counted and the activated numbers may be compared with the set value, and at this time, the activated numbers may be compared with different set values according to the rows. For example, limit values for adjacent rows to lose data may differ according to rows based on characteristics of the rows. Accordingly, set values of the plurality of rows may be stored in the memory device.

Figure 13A:
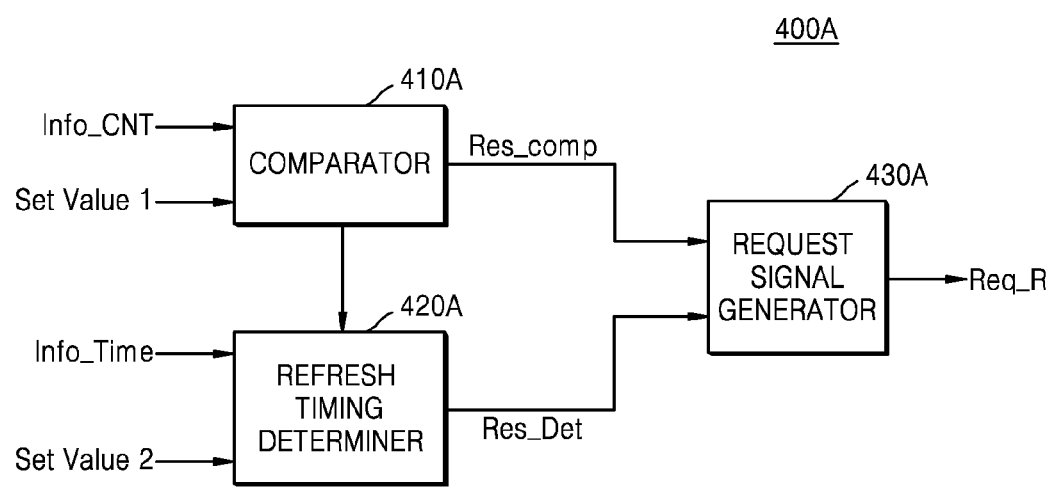
FIGS. 13A and 13B are block diagrams of examples of a memory device performing the exemplary operating method of FIG. 11.
Figure 13B:
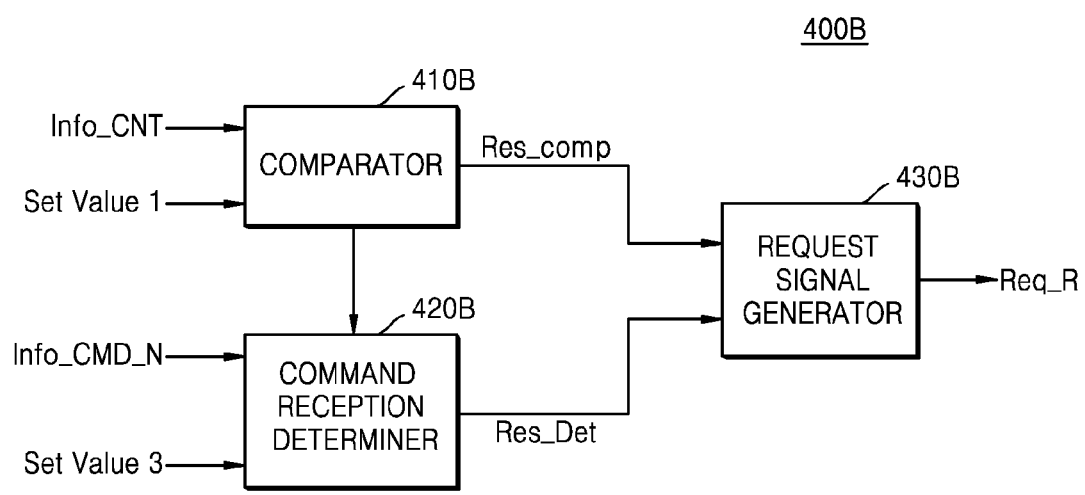

FIGS. 13A and 13B are block diagrams of examples of memory devices 400A and 400B, respectively, performing the exemplary operating method of FIG. 11.

Referring to FIG. 13A, the memory device 400A may include a comparator 410A, a refresh timing determiner 420A, and a request signal generator 430A. In addition, although not illustrated in FIG. 13A, the memory devices 400 may further include at least one or more of the components shown in FIGS. 4 and 5.

The comparator 410A may compare a result Info_CNT, which is a result of counting activated numbers of a plurality of rows included in the memory device 400A, and a first set value Set Value1. As described above, a limit value of an activated number may be pre-defined by a specification, and the first set value Set Value1 may have a value lower than or equal to the limit value. The comparator 410A may generate a comparison result Res_comp when the activated number of at least one row (e.g., first row) is equal to or higher than the first set value Set Value1. When it is determined that a row is activated at least a number of times equal to or greater than the first set value Set Value1, at least one row related to such a row may be detected as a weak row or a disturbed row.

Meanwhile, the refresh timing determiner 420A may determine a refresh state in the memory device 400A and a refresh state of the disturbed row. The determining may be performed by using the time-related information Info_Time related to a point of time when the disturbed row is last refreshed and a second set value Set Value2. In some embodiments, it may be determined whether the disturbed row is refreshed at least one time during an interval corresponding to the second set value Set Value2 before a point of time the comparison result Res_comp is generated. Alternatively, in some embodiments, the second set value Set Value2 may have a value corresponding to a certain point of time, and it may be determined whether the disturbed row is refreshed at least one time after the second set value Set Value2. The refresh timing determiner 420A may provide a determination result Res_Det.

The request signal generator 430A may generate the request signal Req_R based on the comparison result Res_comp and the determination result Res_Det. The request signal generator 430A may determine whether a certain row is disturbed according to the comparison result Res_comp, and may determine whether data of the certain row may be lost according to the determination result Res_Det.

Meanwhile, FIG. 13B illustrates another example of determining a refresh characteristic. As shown in FIG. 13B, the memory device 400B may include a comparator 410B, a command reception determiner 420B, and a request signal generator 430B. The comparator 410B may generate the comparison result Res_comp by comparing the result Info_CNT, which are counts of activated numbers of a plurality of rows included in the memory device 400B, with the first set value Set Value1.

The command reception determiner 420B may determine a reception state of a refresh command provided to the memory device 400B. For example, information Info_CMD_N related to a number of refresh commands received by the memory device 400B during a certain interval before a point of time when the comparison result Res_comp is generated, and a third set value Set Value3 may be provided to the command reception determiner 420B. The command reception determiner 420B may determine whether the number of refresh commands provided to the memory device 400B during the certain interval is equal to or higher than the third set value Set Value3.

As described above, the memory device 400B may perform normal refresh a certain number of times on a plurality of rows of a memory bank, and then perform an additional target refresh on at least one row of the plurality of rows of the memory bank. If a relatively large number of refresh commands is received during a certain interval, a timing for performing target refresh may approach before data of a disturbed row is lost, by taking into account a cycle of performing the target refresh. On the other hand, if a relatively low number of refresh commands is received during a certain interval, a timing for performing target refresh may be long, and thus data of a disturbed row may be lost before the timing approach.

The request signal generator 430A may generate the request signal Req_R based on the comparison result Res_comp and the determination result Res_Det. For example, when a disturbed row is detected and a relatively low number of refresh commands is received by the memory device 400B during a certain interval before a point of time when the disturbed row is detected, the request signal generator 430A may generate and provide the request signal Req_R to a memory controller.

Figure 14:
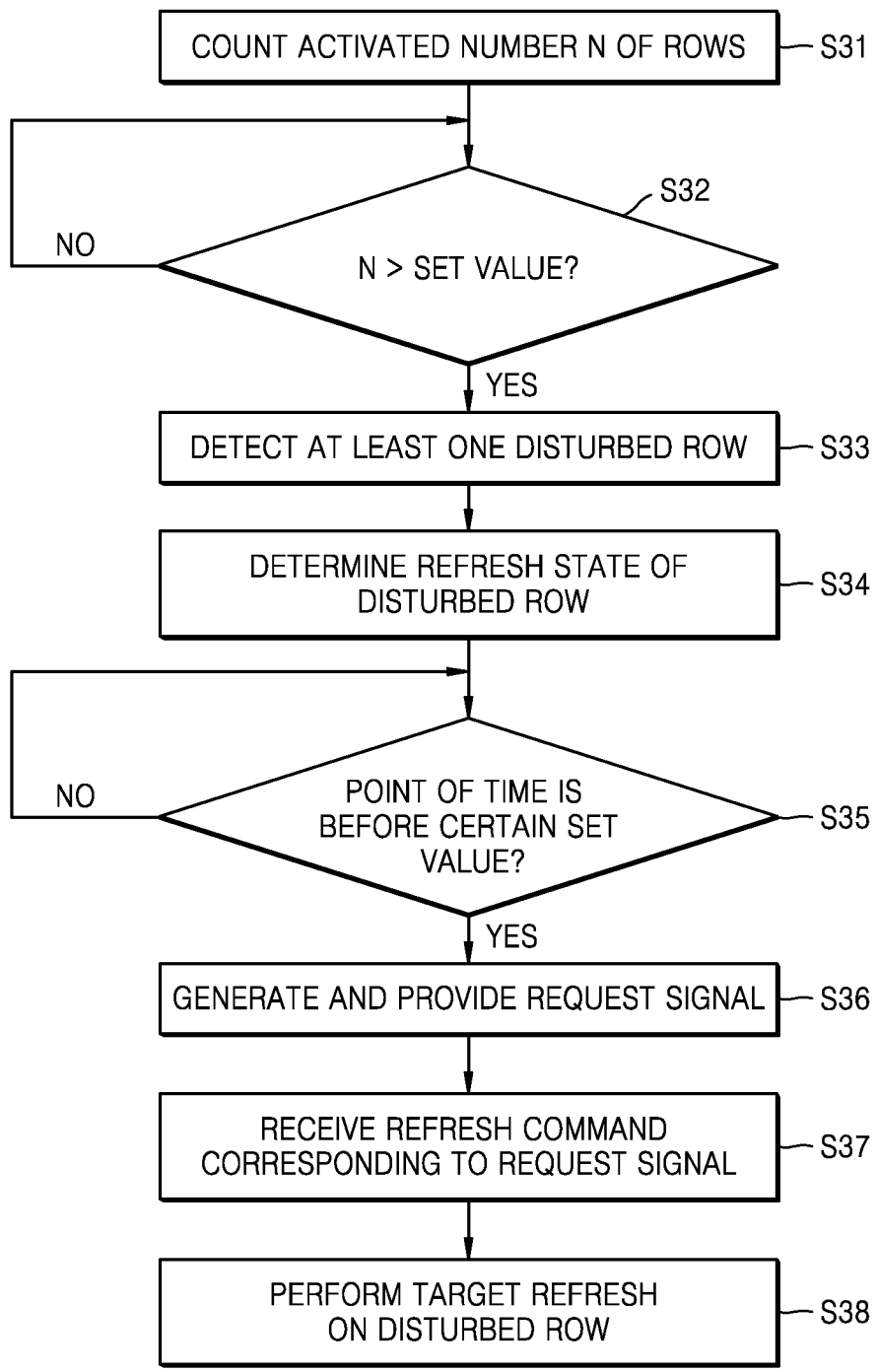
FIG. 14 is a flowchart of detailed operations of the exemplary memory devices of FIGS. 13A and 13B.
Figure 15:
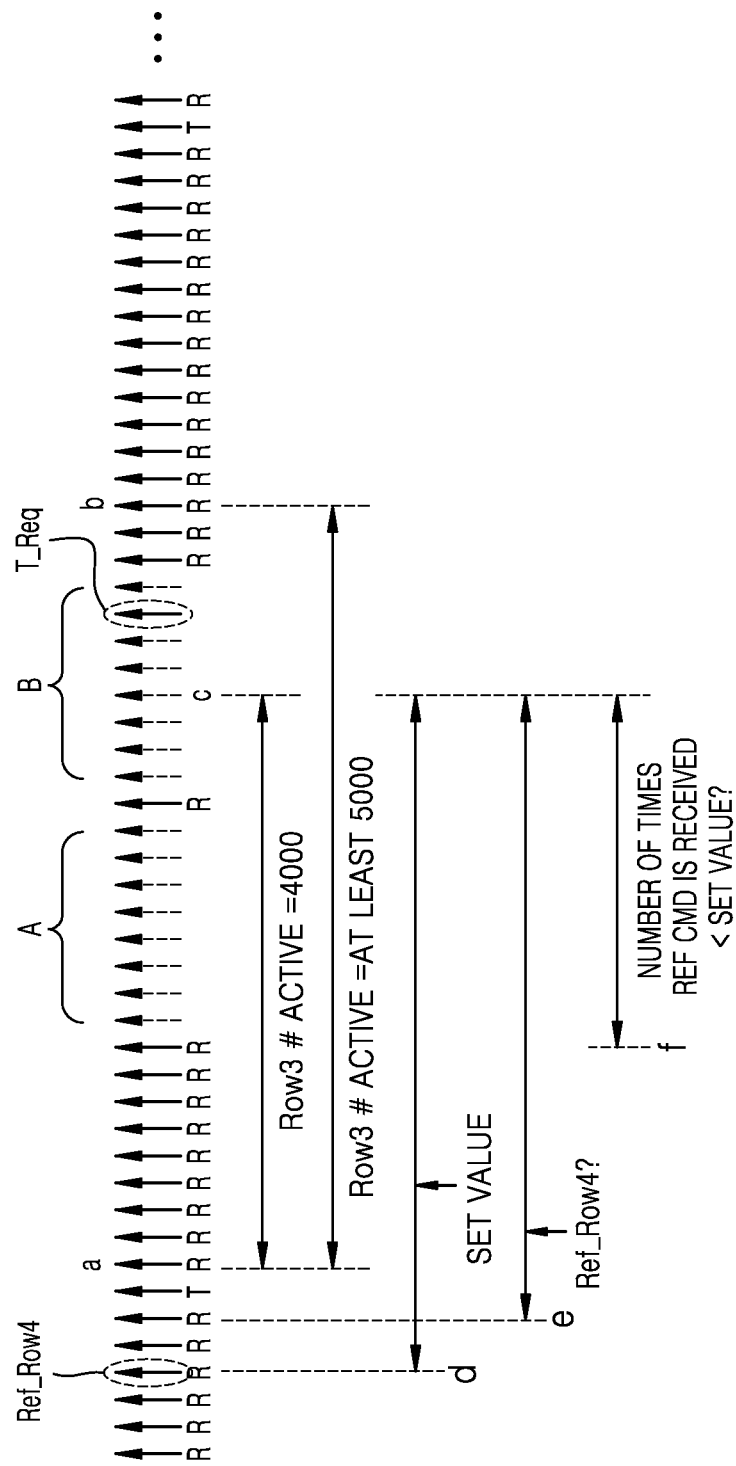
FIG. 15 is a diagram illustrating an example of a refresh operation performed by the exemplary memory devices of FIGS. 13A and 13B.

FIG. 14 is a flowchart of detailed operations of an exemplary device, such as, for example, the memory devices 400A and 400B of FIGS. 13A and 13B. FIG. 15 is a diagram illustrating an example of a refresh operation performed by an exemplary memory device, such as, for example, the memory devices 400A and 400B of FIGS. 13A and 13B. In FIGS. 14 and 15, a fourth row is disturbed as a third row is frequently activated.

Referring to FIG. 14, activated numbers N of rows included in a memory device are counted in operation S31, and it is determined whether the activated number N of a certain row, for example, a first row (e.g., ROW3), is equal to or higher than a set value in operation S32. For example, for each row in a memory device, the number of times the row is activated may be counted and stored in the memory device. If there is no row that is activated at least the set value (S32, No), an operation of comparing the activated number N and the set value may be repeated (S31).

When it is determined that the activated number N of the first row is equal to or higher than the set value (S32, Yes), at least one row adjacent to the first row may be detected as a disturbed row in operation S33. For example, at least one row adjacent to the first row (e.g., rows ROW2 and ROW4) may be detected as disturbed rows. According to an embodiment, another row as well as the rows ROW2 and ROW4 may be detected as a disturbed row, or at least one of the rows ROW2 and ROW4 may be detected as a disturbed row.

Then, a refresh state of the row detected as a disturbed row (e.g., the row ROW4) may be determined in operation S34. As described above, the refresh state may be determined by using a point of time when the row ROW4 is last refreshed and a certain set value. In operation S35, it is determined whether the point of time when the row ROW4 is last refreshed is before the certain set value. If the point of time when the row ROW4 is last refreshed is before the certain set value (S35, Yes), it may be determined that data of the row ROW4 may be lost as the row ROW3 is continuously activated, and thus the memory device may generate and provide a request signal to a memory controller in operation S36. If the point of time when the row ROW4 is last refreshed is after the certain set value (S35, No), a request signal is not generated.

Upon receiving the request signal, the memory controller may generate a refresh command, and the memory device receives the refresh command from the memory controller in operation S37. The memory device may perform request-based refresh, and during the request-based refresh, target refresh may be performed on the disturbed row, for example, the fourth row, in operation S38.

FIG. 15 illustrates various determination examples for generating a request signal. For example, in FIG. 15, when the row ROW3 is frequently activated, the row ROW4 is determined as a bad row. Also, FIG. 15 illustrates the existence of the intervals A and B, in which a refresh command is not provided for a certain time period as a memory controller intensively outputs refresh commands at a certain interval. Also, in FIG. 15, the target refresh T is performed on at least one weak row after the normal refresh R is performed a certain number of times. For example, the target refresh T may be performed one time after the normal refresh R is performed 16 times.

Referring to FIG. 15, the row ROW3 may be frequently activated, e.g., activated at least 5,000 times between time a and time b. An activated number of the row ROW3 may be counted and, at time c, the activated number of the row ROW3 may be determined to exceed 4,000 times that is a set value. Accordingly, a disturbed row (e.g., row ROW4) may be determined at the time c, and it may be determined whether request-based refresh is to be performed on the row ROW4.

As an example of determining whether to perform the request-based refresh, information about a point of time when the row ROW4 is last refreshed (e.g., time d) may be provided, and the time d may be compared with a certain set value. For example, when the time d corresponds to a time before the certain set value, it indicates that the row ROW4 has not been refreshed within a relatively recent time period, and thus a request signal for performing the request-based refresh on the row ROW4 may be generated. On the other hand, when the time d corresponds to a time after the certain set value, it indicates that the fourth row ROW4 is refreshed a relatively short time before, and thus the row ROW4 may normally maintain data even after the row ROW3 is activated 5,000 times. Thus, a request signal for request-based refresh may not be generated.

As another example, a time e having a time difference from the time c according to a pre-set value may be determined. For example, time information related to an interval between the time c and the time e may be provided, and it may be determined whether the row ROW4 is refreshed at least one time between the time c and the time e. If the row ROW4 is refreshed between the time c and the time e, it indicates that the row ROW4 is refreshed a relatively short time before, and thus a request signal for request-based refresh may not be generated. On the other hand, if the row ROW4 is not refreshed between the time c and the time e, a request signal for performing request-based refresh on the row ROW4 may be generated.

In the above example, the time e is before the time a, but an embodiment is not limited thereto. For example, the time e may be variously adjusted, and may be the same as the time a or after the time a. Alternatively, in some embodiments, the time e may be before the time d.

As another example, there may be the intervals A and B in which a refresh command is not provided by a memory controller, and based on existence of the intervals A and B, the number of refresh commands provided to a memory device at a certain interval may differ. If the intervals A and B exist, a time interval between multiple target refreshes T is relatively long, and thus data of the row ROW4 may be lost before the target refresh T is performed on the row ROW4.

In order to determine whether to perform request-based refresh, a point of time before a certain set value from the time c (e.g., a time f) may be determined. Then, a number of times a refresh command is received between the time c and the time f may be determined. The refresh command may be received at refresh intervals (e.g., 7.8 μs) according to certain cycles, and the number of times a refresh command is received may be determined when the refresh command is normally received at the refresh intervals between the time c and the time f. Also, a number of refresh commands actually received between the time c and the time f may be determined.

The performance of request-based refresh may be determined based on results of such various determining. For example, when it is determined whether the number of refresh commands actually received between the time c and the time f is lower than a set value, and when the number of refresh commands actually received is less than the set value, a request signal for performing request-based refresh may be generated. However, when the number of refresh commands actually received is equal to or higher than the set value, the target refresh T may be performed on the row ROW4 after the normal refresh R is performed a certain number of times as described above, and at this time, the target refresh T may be performed before the row ROW3 is activated a number equal to or greater than 5,000 times. Accordingly, a request signal for performing request-based refresh may not be generated when the number of refresh commands actually received is equal to or higher than the set value.

Other embodiments may vary. For example, there may be determined a ratio of a number of refresh commands normally received at a refresh interval between the time c and the time f to a number of refresh commands actually received by a memory device as the intervals A and B, in which a refresh command is not provided. Then, a request signal may be selectively generated based on the ratio.

In the above example, the time f is after the time a, but an embodiment is not limited thereto. For example, the time f may variously adjusted, and may be the same as the time a or the time f may be before the time a.

Figure 16:
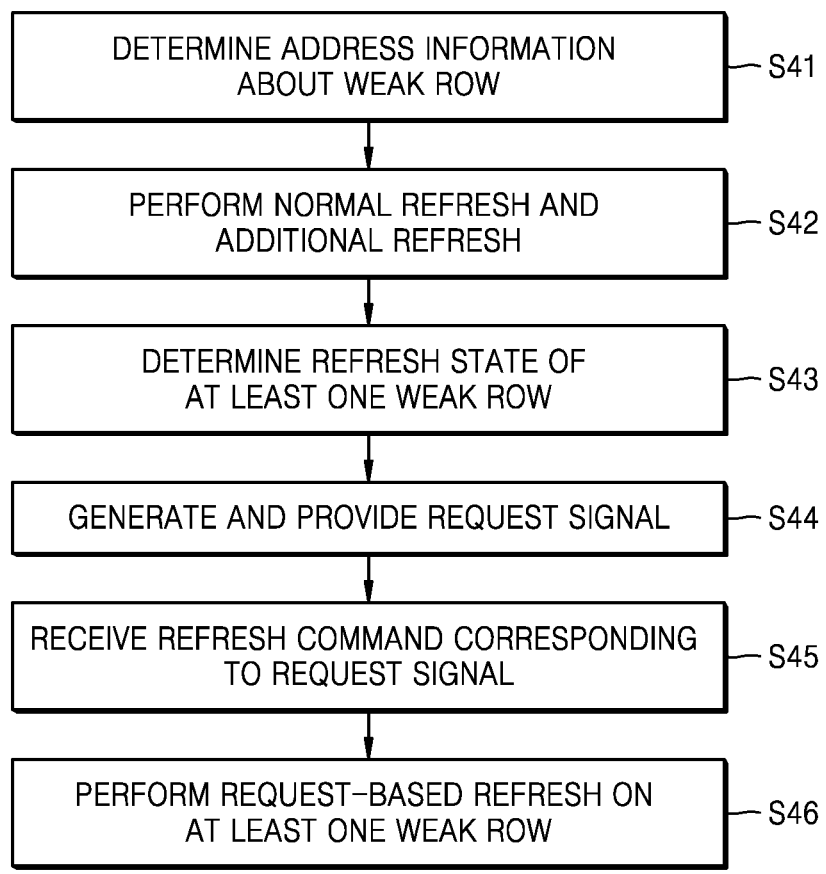
FIG. 16 is a flowchart of an operating method of a memory device, according to another exemplary embodiment.

FIG. 16 is a flowchart of an operating method of a memory device, according to another embodiment. In FIG. 16, address information about a plurality of rows having low data retention characteristics (weak rows) is pre-stored, and request-based refresh is performed on at least one of the weak rows.

Referring to FIG. 16, the memory device may store address information about the plurality of weak rows, which may be generated through a test process, and the address information may be determined during a refresh process, in operation S41. For example, all rows included in the memory device are normally refreshed within refresh cycles, and the weak rows may be additionally refreshed at least one time within the refresh cycles, in operation S42.

According to an embodiment, request-based refresh may be performed on at least one of the weak rows. In order to perform the request-based refresh, a refresh state of the memory device or at least one weak row may be determined in operation S43 as described above. For example, the weak rows may have different data retention characteristics, and a weak row that has a lower data retention characteristic than other weak rows may be set as a target of request-based refresh.

Based on a result of the determining, when the request-based refresh is to be performed on the at least one weak row, the memory device may generate a request signal as described above and provide the request signal to a memory controller, in operation S44. Also, the memory device receives a refresh command generated based on the request signal, from the memory controller, in operation S45. Accordingly, the request-based refresh may be performed on the at least one weak row in operation S46.

Figure 17:
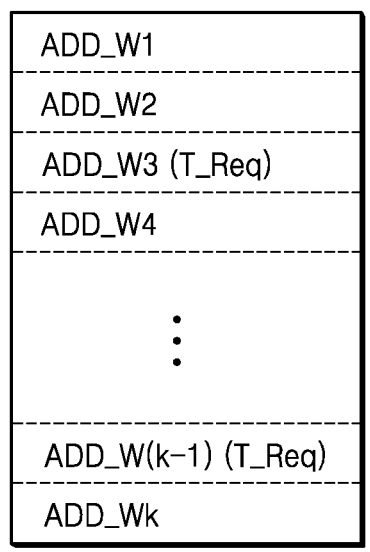
FIG. 17 is a diagram illustrating an example of address information of a weak row, which is stored in a memory device.

Operations of the memory device of FIG. 16 will now be described with reference to FIGS. 17 and 18. FIG. 17 is a diagram illustrating an example of address information of a weak row, which is stored in the memory device, and FIG. 18 is a diagram illustrating an example of performing request-based refresh on at least one weak row.

Referring to FIG. 17, the memory device includes a plurality of rows, wherein k rows may be weak rows. First address information through $k^{th}$ address information ADD_W1 through ADD_Wk of the k weak rows may be stored in the memory device. The k weak rows may have low data retention characteristics compared to normal rows, and may have different data retention characteristics from each other.

For example, a third weak row (e.g., corresponding to address information ADD_W3) and a $(k-1)^{th}$ weak row (e.g., corresponding to address information ADD_W(k-1)$^{th}$) from among the k weak rows may need to be more frequently refreshed than the remaining weak rows, and as described above, when an interval in which a refresh command is not provided from a memory controller exists, data of the third weak row and the $(k-1)^{th}$ weak row is more likely to be lost. According to an embodiment, whether to perform request-based refresh of the third weak row and the $(k-1)^{th}$ weak row is determined and a request signal may be generated based on a result of the determining. For example, when one or more conditions are met, it may be determined to perform a request-based or supplemental refresh.

Figure 18:
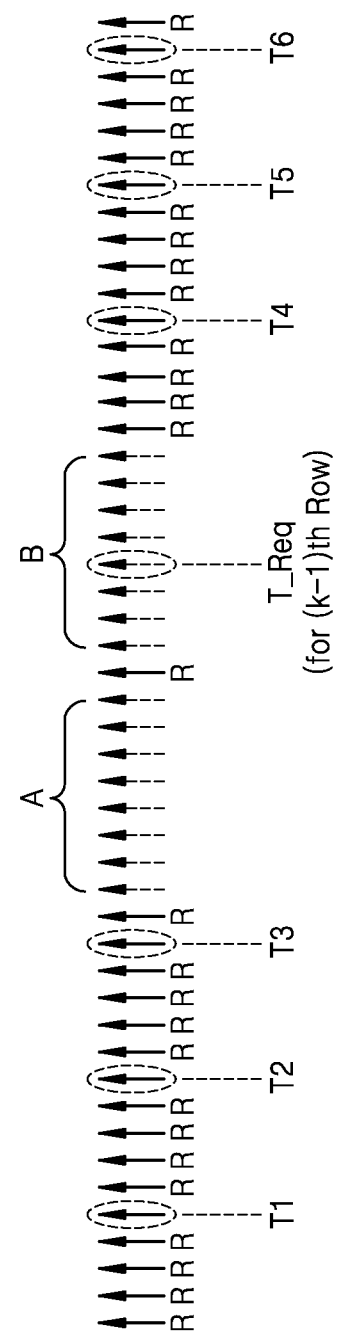
FIG. 18 is a diagram illustrating an example of performing request-based refresh on at least one weak row.

Referring to FIG. 18, the memory device may perform the target refresh T after performing the normal refresh R a certain number of times. For example, in FIG. 18, the target refresh T is performed one time after the normal refresh R is performed four times.

The k weak rows corresponding to the first address information ADD_W1 through the $k^{th}$ address information ADD_Wk of FIG. 17 may be sequentially refreshed whenever timing for performing the target refresh T is reached. For example, a weak row corresponding to the first address information ADD_Q1 may be refreshed during first target refresh T1, a weak row corresponding to the second address information ADD_W2 is refreshed during second target refresh T2, and a weak row corresponding to third address information ADD_W3 is refreshed during third target refresh T3.

The intervals A and B in which a refresh command is not output from a memory system may exist, and thus a long time may be consumed until a next target refresh is performed. As described above, the memory device may determine a refresh state (for example, a number of times a refresh command is received for certain duration) of the memory device, and determine whether to perform request-based refresh based on the refresh state. Based on the determination, a request signal is provided to the memory controller and the memory controller may provide a refresh command to the memory device.

The memory device may perform request-based refresh in response to the refresh command. For example, the request-based refresh T_Req may be performed on a weak row corresponding to the $(k-1)^{th}$ address information ADD_W (k-1), which has a relatively low data retention characteristic from among those corresponding to the first address information ADD_W1 through the $k^{th}$ address information ADD_Wk. Also, for example, since another weak row having a low data retention characteristic, for example, a weak row corresponding to the third address information ADD_W3, is refreshed during the third target refresh T3 immediately before, request-based refresh may not be performed on the weak row corresponding to the third address information ADD_W3.

Then, upon receiving the refresh command from the memory controller, the memory device may perform the target refresh T one time after performing the normal refresh R four times as described above.

Figure 19:
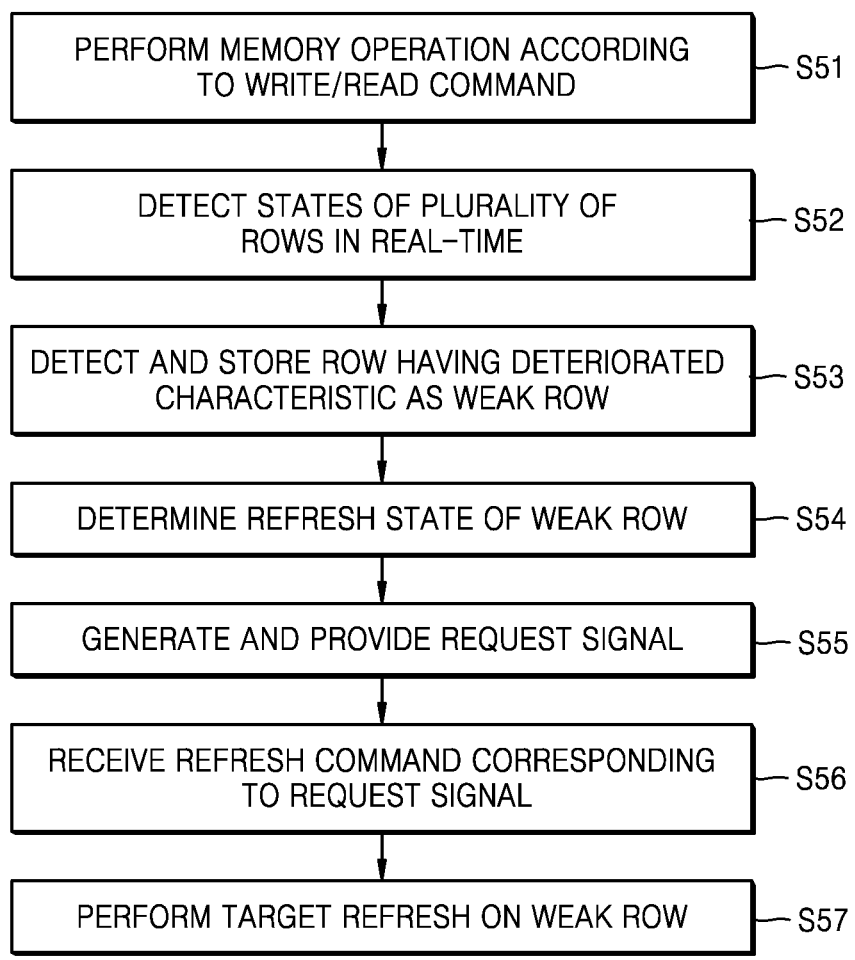
FIG. 19 is a flowchart of an operating method of a memory device, according to another exemplary embodiment.

FIG. 19 is a flowchart of an operating method of a memory device, according to another embodiment. In FIG. 19, at least one row having a possibility of data loss is detected during a memory operation, and request-based refresh is performed on the at least one row.

Referring to FIG. 19, the memory device performs a memory operation according to a write/read command from a memory controller, in operation S51. The memory device may have a progressive defect due to various reasons as a memory operation is performed or the memory device is aged, and for example, some of a plurality of rows included in the memory device may have a progressive defect. Data retention characteristics of rows having progressive defects may deteriorate.

The memory device may detect states of the rows in real-time in operation S52, and may detect and store at least one row having a deteriorated characteristic as a weak row in operation S53. For example, address information of the row detected as a weak row may be stored.

In order to determine whether to perform request-based refresh of the weak row, a refresh state of the weak row may be determined as described above, in operation S54. If it is determined that the request-based refresh is to be performed, the memory device may generate and provide a request signal to a memory controller as described above, in operation S55. Also, the memory device receives a refresh command generated based on the request signal from the memory controller, in operation S56. Accordingly, request-based refresh may be performed on the at least one row detected as a weak row in real-time, in operation S57.

According to an embodiment, the address information of the weak row detected in real-time may be stored in a refresh controller described above, and accordingly, target refresh according to certain cycles may be performed on the weak row detected in real-time. Also, as described above, when there is an interval in which a refresh command is not received from the memory device, performance of request-based refresh on the weak row detected in real-time may be determined.

Figure 20:
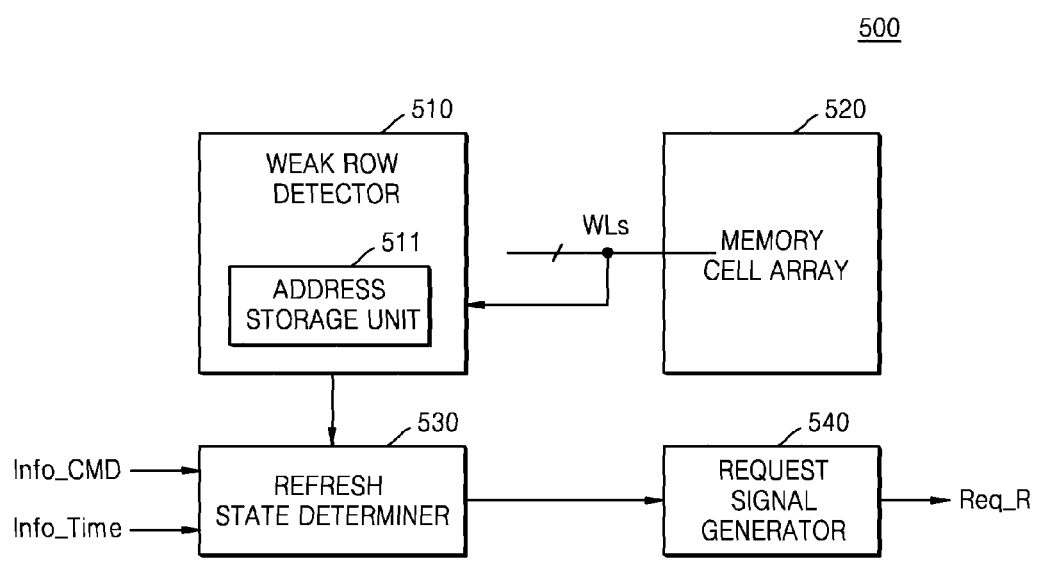
FIG. 20 is a block diagram of components of a memory device related to the exemplary operating method of FIG. 19.
Figure 21:
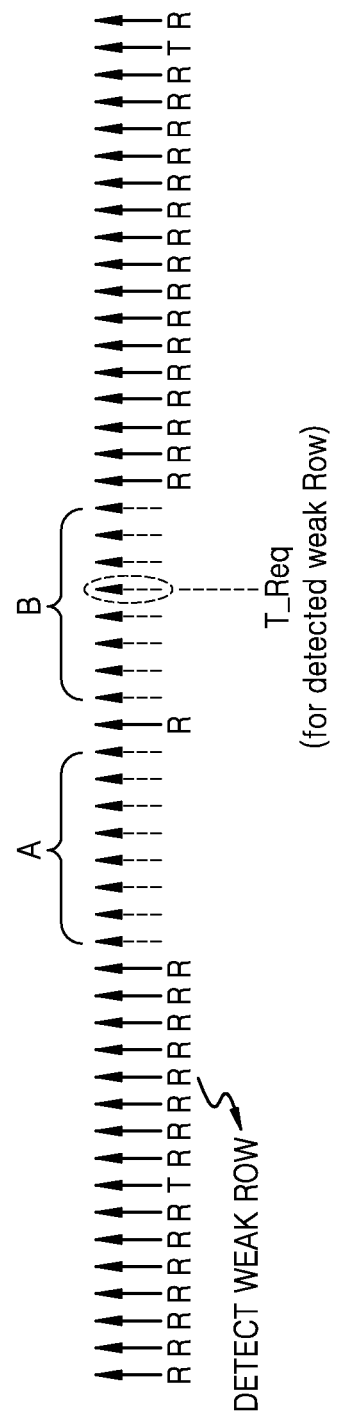
FIG. 21 illustrates an example of performing request-based refresh on a weak row detected in real-time.

Operations of the memory device of FIG. 19 will now be described with reference to FIGS. 20 and 21. FIG. 20 is a block diagram of components of a memory device 500 related to the operating method of FIG. 19, and FIG. 21 illustrates an example of performing request-based refresh on a weak row detected in real-time.

Referring to FIG. 20, the memory device 500 may include a weak row detector 510, a memory cell array 520, a refresh state determiner 530, and a request signal generator 540. The memory cell array 520 may include a plurality of word lines WLs connected to a plurality of rows. The weak row detector 510 is electrically connected to the plurality of word lines WLs, and thus may detect states of the plurality of rows in real-time. For example, during operation of the memory device 500, the weak row detector 510 may detect the states of the rows by detecting electric leakage of each of the word lines WLs. Determining whether to perform a targeted refresh may include measuring at least one of a voltage and a current of the plurality of rows, and detecting at least one row having a low leakage characteristic as a weak (or disturbed) row according to a result of the measuring. When at least one row is determined to be a weak row, the request-based refresh may be performed on the detected at least one weak row.

When it is determined that the electric leakage of at least one word line exceeds a set value, at least one row connected to the at least one word line may be detected as a weak row. The weak row detector 510 may include an address storage unit 511 that stores address information of the detected row.

The refresh state determiner 530 may determine a refresh state of the memory device 500 as described above, and provide a result of the determining. For example, the refresh state determiner 530 may determine the refresh state by using the command-related information Info_CMD provided to the memory device 500 and/or the time-related information Info_Time. For example, it may be determined whether a number of refresh commands received within a certain time interval is lower than or equal to a certain set value based on the command-related information Info_CMD, or whether a point of time when the detected weak row is last refreshed is before a certain set value based on the time-related information Info_Time. The request signal generator 540 may generate the request signal Req_R based on results of such various determining.

Meanwhile, referring to FIG. 21, a weak row is detected and request-based refresh is performed based on the results of the determining. In FIG. 21, as address information of at least one weak row (e.g., a row having low data retention characteristics) is stored in the memory device, the target refresh T is further performed after the normal refresh R is performed a certain number of times. For example, the target refresh T may be performed one time after the normal refresh R is performed 16 times.

A row connected to one of a plurality of word lines may be detected as a weak row in real-time as a result of detecting states of the plurality of word lines of a memory cell array. Also, whether to perform request-based refresh of the weak row may be determined.

As shown in FIG. 21, the intervals A and B, in which a refresh command is not provided to the memory device, may exist, and accordingly, a long time may be consumed until a next target refresh T is performed. The memory device may determine whether to perform the request-based refresh of the weak row detected in real-time, as described above. Then, the request-based refresh T_Req may be performed on the weak row detected in real-time based on the determination. In other words, the memory device may perform the request-based refresh T_Req on the weak row detected in real-time, without having to wait for the target refresh T that may be performed after a long time.

Figure 22:
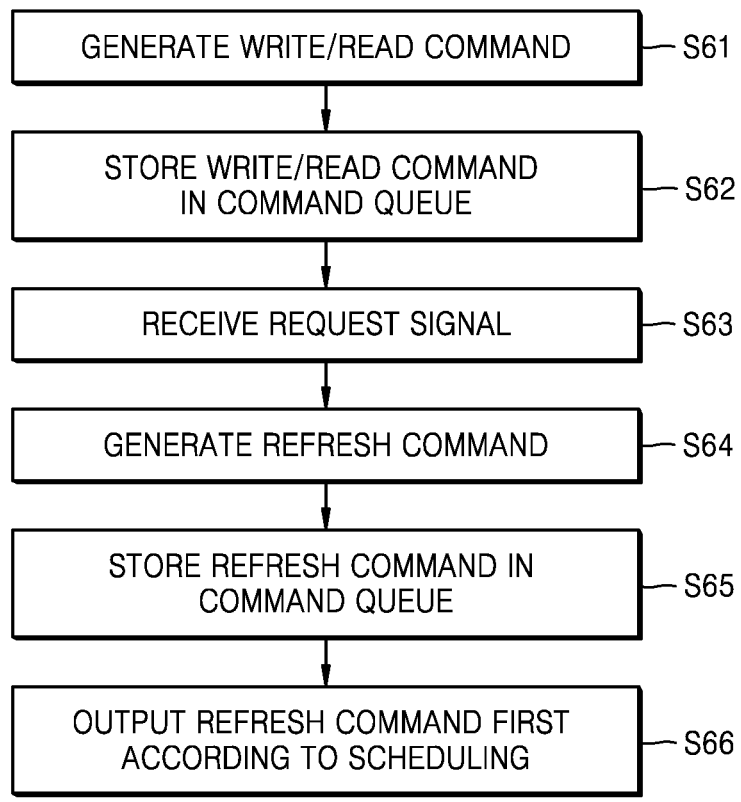
FIG. 22 is a flowchart of an operating method of a memory controller, according to an exemplary embodiment.

FIG. 22 is a flowchart of an operating method of a memory controller, according to an embodiment.

Referring to FIG. 22, the memory controller generates a write/read command for writing/reading data according to a request from a host, in operation S61. Also, the memory controller stores the write/read command in a command queue therein, in operation S62.

The memory controller may control the memory device to perform a write/read operation while controlling the memory device to perform a refresh operation by providing various commands stored in the command queue to the memory device. Then, according to self-determination of the memory device, the memory device may generate a request signal requesting the memory controller to provide a refresh command and the memory controller may receive the request signal from the memory device, in operation S63. Then, the memory controller generates a refresh command in response to the request signal in operation S64, and stores the refresh command in the command queue in operation S65.

The memory controller performs scheduling of the commands stored in the command queue. The scheduling may be performed based on the request signal provided from the memory device. The command queue may store various write/read commands according to requests from a host and the refresh command generated in response to the request signal. Based on the scheduling, the refresh command may be output before other commands, in operation S66.

Figure 23:
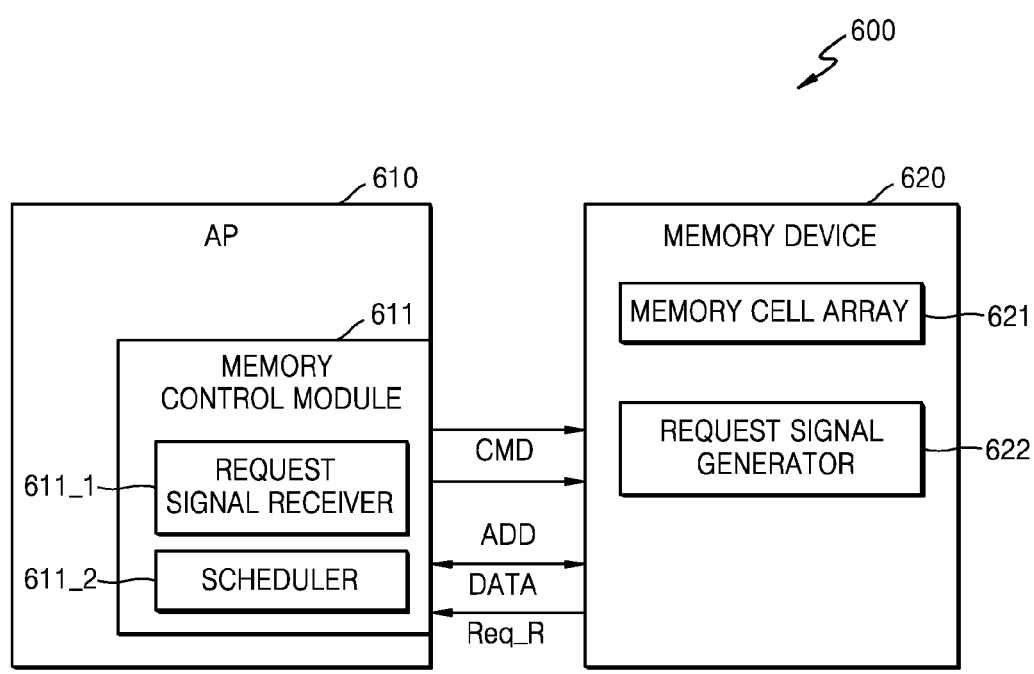
FIG. 23 is a block diagram of a data processing system including a memory controller and a memory device, according to an exemplary embodiment.

FIG. 23 is a block diagram of a data processing system 600 including a memory controller and a memory device, according to an embodiment.

As shown in FIG. 23, the data processing system 600 may include an application processor 610 operating as a host, and a memory device 620. The memory device 620 may be any type of a memory, and for example, DRAM according to the embodiments described above may be applied to the memory device 620, or any memory device requiring refresh (for example, a non-volatile memory, such as a resistive memory) may be applied to the memory device 620. Also, although not illustrated in FIG. 23, the memory device 620 according to an embodiment may be an embedded memory included in the application processor 610.

The application processor 610 may be realized as a system on chip (SoC). The SoC may include a system bus (not shown) to which a protocol having a certain bus standard, and may include various intellectual properties (IPs) connected to the system bus. As a standard of the system bus, an Advanced Microcontroller Bus Architecture (AMBA) protocol of Advanced RISC Machine (ARM) may be applied. Bus types of the AMBA may include Advanced High-Performance Bus (AHB), Advanced Peripheral Bus (APB), Advanced eXtensible Interface (AXI), AXI4, and AXI Coherency Extensions (ACE). In addition, another type of protocol, such as uNetwork of Sonics Inc., CoreConnect of IBM, or an open core protocol of OCP-IP may be applied.

The application processor 610 may include a memory control module 611 for controlling the memory device 620, and the memory control module 611 may perform functions of a memory controller according to the above embodiments. Also, the memory device 620 may include a memory cell array 621 and a request signal generator 622, wherein the request signal generator 622 may generate the request signal Req_R based on a result of determining whether to perform request-based refresh of at least one row according to the embodiments described above.

The memory control module 611 may provide the command CMD and the address ADD to the memory device 620 in order to control a memory operation. Also, the data DATA may be transferred between the application processor 610 and the memory device 620 according to a memory operation, such as a data access. Also, according to an embodiment, the memory control module 611 may include a request signal receiver 611_1 and a scheduler 611_2. The memory control module 611 may generate a refresh command according to the request signal Req_R received through the request signal receiver 611_1. Also, the scheduler 611_2 may perform scheduling on write/read commands and refresh commands stored in a command queue (not shown).

Figure 24:
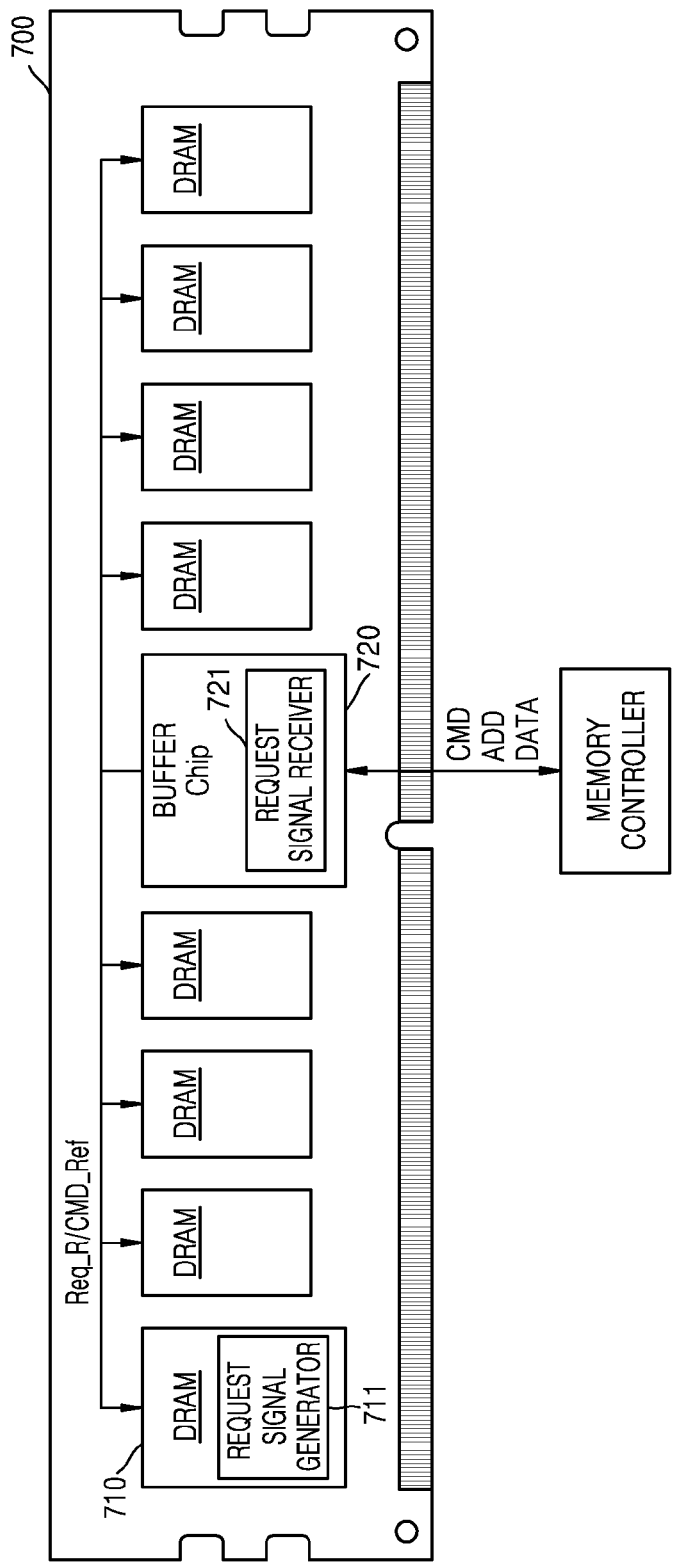
FIG. 24 is a diagram of a memory module according to an exemplary embodiment.

FIG. 24 is a diagram of a memory module 700 according to an embodiment.

Referring to FIG. 24, the memory module 700 may include a plurality of memory chips 710 and a buffer chip 720. The memory module 700 may be any type of memory module, such as a load reduced dual in-line memory module (LR-DIMM) or another memory module. The memory module 700 may be connected to a memory controller through the buffer chip 720 to receive the command CMD, the address ADD, and the data DATA.

The buffer chip 720 may control a refresh operation of the memory chips 710 according to the command CMD and the address ADD from the memory controller. Also, according to the above embodiments, the buffer chip 720 may manage a refresh operation on rows included in each of the memory chips 710. For example, the buffer chip 720 may include a request signal receiver 721 and when the request signal Req_R is provided from the memory chips 710, the buffer chip 720 may provide information about the request signal Req_R to the memory controller.

Meanwhile, the memory chips 710 may each determine whether to perform request-based refresh according to one or more embodiments, and may each include a request signal generator 711 in order to generate the request signal Req_R according to an embodiment.

Figure 25:
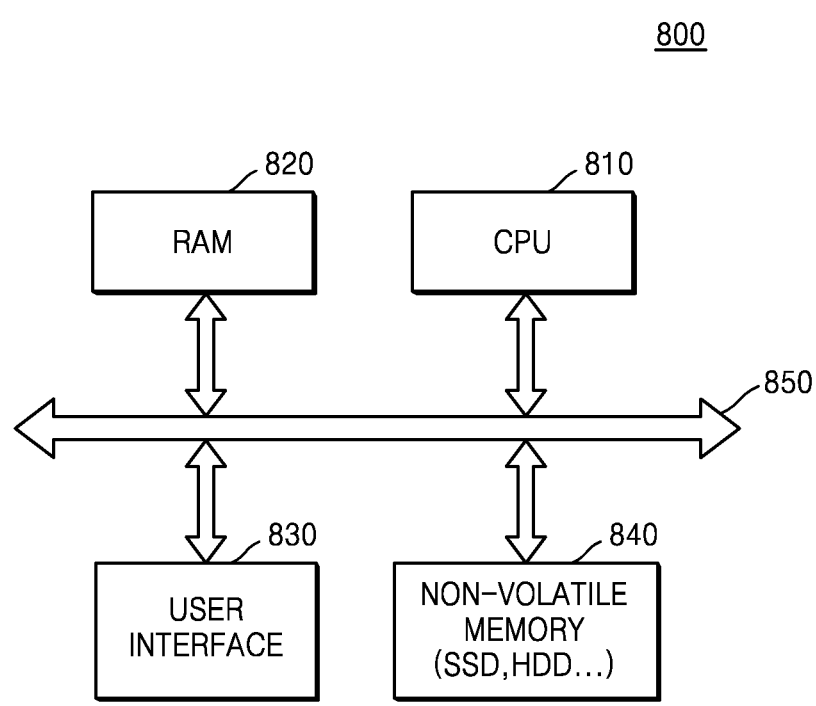
FIG. 25 is a block diagram of a computing system on which a memory system is mounted, according to an exemplary embodiment.

FIG. 25 is a block diagram of a computing system 800 on which a memory system is mounted, according to an embodiment. A memory device according to an embodiment may be mounted on the computing system 800 such as a mobile device or a desktop computer, as a RAM 820. The memory device mounted as the RAM 820 may be any one memory device described above. Also, a memory controller according to an embodiment may be included in the RAM 820, or may be realized in a central processing unit (CPU) 810, as a memory control module.

The computing system 800 according to an embodiment includes the CPU 810, the RAM 820, a user interface 830, and a non-volatile memory 840, which are electrically connected to a bus 850. The non-volatile memory 840 may be a mass storage device, such as solid state disk (SSD) or a hard disk drive (HDD).

As the memory device (or the memory system) according to an embodiment is applied to the computing system 800, a memory controller that may be included in the RAM 820 and/or a memory control module that may be included in the CPU 810 may generate a refresh command in response to a request signal from a memory device as described above. Also, a memory device included in the RAM 820 may determine whether to perform request-based refresh of at least one row and generate a request signal according a result of the determining.

According to a memory device and a memory system, and an operating method of the memory device according to one or more embodiments, since the memory device determines whether to refresh and generates a request signal for a refresh command accordingly, the memory device may self-manage a possibility of data loss.

Also, according to a memory device and a memory system, and an operating method of the memory device according to one or more embodiments, request-based refresh is performed on a row having a high possibility of data loss or a row having a low data retention characteristic, and thus data stability of the memory device may increase.

While the concepts have been particularly shown and described with reference to embodiments thereof, it will be understood that various changes in form and details may be made therein without departing from the spirit and scope of the following claims.

What is claimed is:

1. An operating method of a memory device, the operating method comprising:
    determining, by the memory device, a weak row based on a counting of an activated number of at least one row;
    outputting, to a memory controller, a request for refresh on the weak row based on a result of the determining;
    receiving, from the memory controller, a refresh command in response to the request for the refresh; and
    performing request-based refresh on the weak row in response to the receiving of the refresh command.

2. The operating method of claim 1, wherein the determining the weak row comprises:
    counting an activated number of a first row; and
    determining a second row adjacent to the first row as the weak row based on a result of the counting.

3. The operating method of claim 2, wherein the second row is determined as the weak row when the activated number of the first row is equal to or higher than a set value.

4. The operating method of claim 3, wherein the performing the request-based refresh further comprises:
    performing the request-based refresh on the second row before the activated number of the first row exceeds the set value,
    wherein a limit value of the activated number of the first row, which causes data of the second row to be lost, is pre-defined by a specification.

5. The operating method of claim 1, further comprising:
    determining a refresh state of the weak row; and
    determining a refresh condition of the weak row based on a result of the determined refresh state,
    wherein the request for the refresh is selectively output based on the refresh condition.

6. The operating method of claim 5, wherein the determining the refresh condition comprises:

comparing a point of time when the weak row is last refreshed with a set value.

7. The operating method of claim 1, further comprising:
determining a refresh state of the memory device; and
determining a refresh condition of the weak row based on the refresh state of the memory device,
wherein the request for the refresh is selectively output based on the refresh condition.

8. The operating method of claim 7, wherein the determining the refresh condition comprises:
determining a number of refresh commands provided to the memory device during a certain interval.

9. The operating method of claim 1, further comprising:
communicating command, address, and data signals between the memory device and the memory controller through a plurality of channels; and
outputting the request for the refresh to the memory controller through a side channel different from the plurality of channels for communicating the command, the address, and the data signals.

10. The operating method of claim 1, further comprising:
communicating command, address, and data signals between the memory device and the memory controller through a plurality of channels; and
outputting the request for the refresh to the memory controller through one of the plurality of channels related to communicating the command, the address, and the data signals when the memory device is in a busy state.

11. The operating method of claim 1, wherein determining the weak row comprises:
counting an activated number of a first row; and
detecting at least two weak rows according to a result of the counting of the activated number,
wherein the at least two weak rows are sequentially refreshed in response to the refresh command.

12. An operating method of a memory system comprising a memory controller, the operating method comprising:
generating, by the memory controller, a first command related to writing and reading;
receiving, from a memory device, a request signal for requesting to output a refresh command;
generating, by the memory controller, a second command related to request-based refresh in response to the request signal; and
outputting, to the memory device, the second command based on scheduling of the first and second commands.

13. The operating method of claim 12, further comprising:
storing a plurality of first commands in a command queue; and
storing the second command in the command queue with the first commands after the plurality of the first commands are stored in the command queue,
wherein the second command is output before at least one of the plurality of first commands based on the scheduling.

14. The operating method of claim 12, wherein the memory system further comprises a memory device and the memory device comprises a plurality of rows, and
the operating method further comprises:
determining existence of conditions for performing request-based refresh on at least one row; and
generating the request signal based on the determining.

15. The operating method of claim 14, wherein the determining the existence of the conditions comprises:
counting an activated number of a first row from among the plurality of rows;
detecting at least one second row adjacent to the first row as a weak row based on a result of the counting; and
determining a refresh state of the second row.

16. The operating method of claim 15, wherein the request signal is generated when a point of time when the second row is last refreshed is before a set value indicating a certain point of time.

17. A memory device comprising:
a memory cell array comprising a plurality of rows;
a refresh controller configured to control a refresh operation on the plurality of rows; and
control logic configured to determine existence of conditions for performing request-based refresh on the at least one row during operation of the memory device, and output a request signal for requesting a refresh command based on the determining the existence of the conditions.

18. The memory device of claim 17, wherein the control logic comprises:
a weak row detector configured to detect at least one second row adjacent to a first row as a weak row when an activated number of the first row is equal to or higher than a set value; and
a refresh state determiner configured to determine the performance of request-based refresh on the second row based on a result of determining a refresh state of the second row.

19. The memory device of claim 18, wherein the control logic further comprises a request signal generator configured to generate the request signal according to a result of the determining,
wherein the refresh controller is further configured to perform refresh on the at least one second row in response to a refresh command received according to the request signal.

20. The memory device of claim 18, wherein the weak row detector comprises a comparator configured to compare a result of counting the activated number of the first row and the set value and generate a comparison result.

* * * * *